United States Patent
Follett et al.

(10) Patent No.: US 7,650,911 B2
(45) Date of Patent: Jan. 26, 2010

(54) METHOD FOR RESTRICTING FLUID FLOW IN A PASSAGEWAY

(75) Inventors: Dan B. Follett, Morgan, UT (US);
David T. Cumming, Park City, UT (US);
Emily B. Christopulos, Salt Lake City, UT (US)

(73) Assignee: Gaphog International, a Utah LLC, Salt Lake City, UT (US)

( * ) Notice: Subject to any disclaimer, the term of this patent is extended or adjusted under 35 U.S.C. 154(b) by 417 days.

(21) Appl. No.: 11/555,162

(22) Filed: Oct. 31, 2006

(65) Prior Publication Data

US 2008/0020700 A1 Jan. 24, 2008

Related U.S. Application Data

(63) Continuation-in-part of application No. 11/458,368, filed on Jul. 18, 2006.

(51) Int. Cl.
*F16L 55/00* (2006.01)
(52) U.S. Cl. .................. 138/108; 138/110; 138/149
(58) Field of Classification Search ............ 138/110, 138/108, 106, 94, 149
See application file for complete search history.

(56) References Cited

U.S. PATENT DOCUMENTS

| | | | | |
|---|---|---|---|---|
| 1,856,109 A * | 5/1932 | Murray et al. | ............ | 174/146 |
| 2,153,787 A * | 4/1939 | Anderson | ............ | 166/241.4 |
| 2,531,658 A * | 11/1950 | Walsh | ............ | 138/101 |
| 3,642,308 A * | 2/1972 | Zeile et al. | ............ | 285/47 |
| 3,747,632 A | 7/1973 | Kok et al. | ............ | 137/375 |
| 4,093,818 A * | 6/1978 | Thwaites et al. | ............ | 174/505 |
| 4,754,590 A | 7/1988 | Gordon | ............ | 52/741 |
| 5,014,483 A | 5/1991 | Southern | ............ | 52/514 |
| 5,018,260 A * | 5/1991 | Ziu | ............ | 24/555 |
| 5,093,384 A | 3/1992 | Hayashi et al. | ............ | 521/159 |
| 5,497,809 A * | 3/1996 | Wolf | ............ | 138/113 |
| 5,687,771 A | 11/1997 | Clough | ............ | 138/89 |
| 5,692,545 A * | 12/1997 | Rodrigue | ............ | 138/115 |
| 5,878,784 A | 3/1999 | Sales et al. | ............ | 138/93 |
| 5,947,344 A | 9/1999 | Jangaard | ............ | 222/494 |
| 6,003,559 A * | 12/1999 | Baker | ............ | 138/108 |
| 6,062,267 A * | 5/2000 | Fleming | ............ | 138/114 |
| 6,080,461 A | 6/2000 | Wozniak et al. | ............ | 428/66.6 |
| 6,408,981 B1 | 6/2002 | Smith et al. | ............ | 181/315 |

(Continued)

FOREIGN PATENT DOCUMENTS

DE  003644414  4/1988

(Continued)

*Primary Examiner*—Patrick F Brinson
(74) *Attorney, Agent, or Firm*—Workman Nydegger

(57) ABSTRACT

A method of restricting fluid flow through a passageway can include inserting a device comprising memory foam into the passageway. The expanded memory foam can have a cross-sectional profile with a shape and size to securely fit within the passageway so as to restrict fluid flow through the passageway. Additionally, the memory foam can have a receiving portion that extends from the first end to the second end that is configured for receiving an object that extends from the first end to the second end. The receiving portion can have various configurations and can include internal portions and external portions of the memory foam. The receiving portion can self-form a conduit around the object by expanding the memory foam around the object.

20 Claims, 5 Drawing Sheets

U.S. PATENT DOCUMENTS

| | | | |
|---|---|---|---|
| 6,428,017 B1 | 8/2002 | Galonska et al. | 277/616 |
| 6,927,976 B1 | 8/2005 | Malone et al. | 361/690 |
| 2003/0074018 A1 | 4/2003 | Torstensen et al. | 606/197 |
| 2005/0067170 A1 | 3/2005 | Richard | 166/387 |

FOREIGN PATENT DOCUMENTS

| | | |
|---|---|---|
| EP | 000699862 | 3/1996 |
| WO | WO 9728540 | 8/1997 |

\* cited by examiner

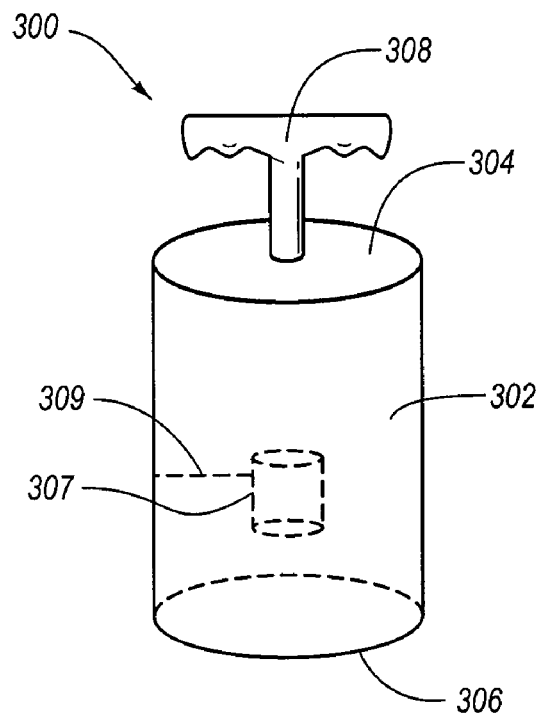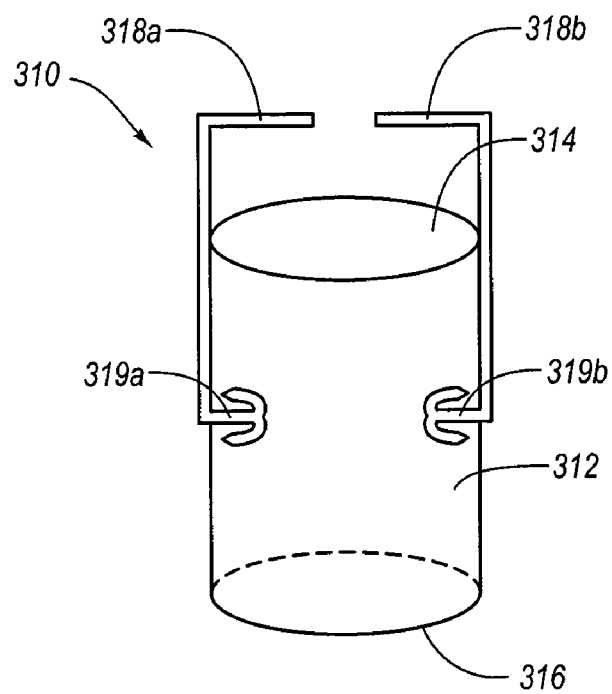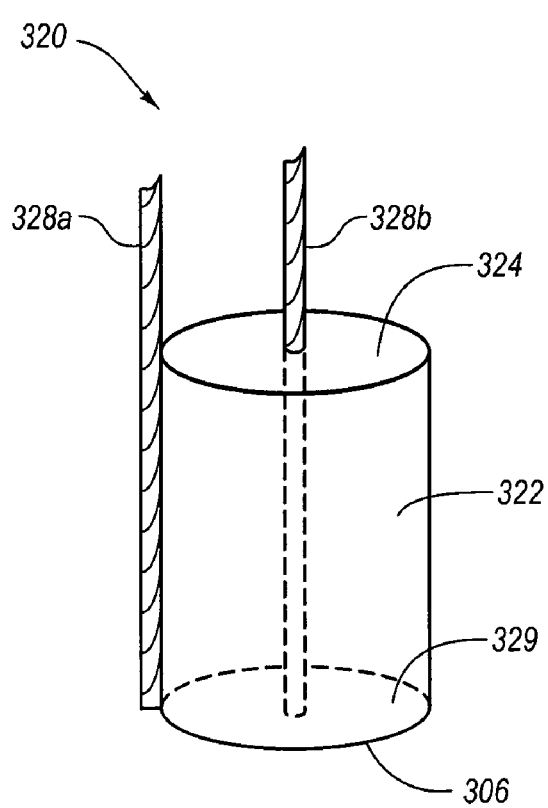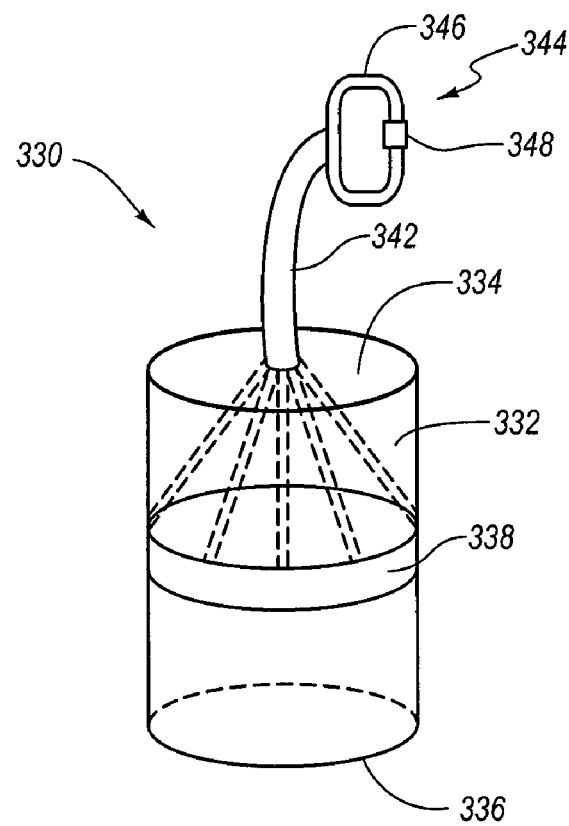

METHOD FOR RESTRICTING FLUID FLOW IN A PASSAGEWAY

CROSS-REFERENCE OF RELATED APPLICATION

The present invention is a continuation-in-part of U.S. patent application Ser. No. 11/458,368, filed Jul. 18, 2006, which is incorporated herein by reference.

BACKGROUND OF THE INVENTION

1. The Field of the Invention

The present invention is related to methods of using devices and systems that include memory foam for use in restricting the fluid flow (e.g., liquid or gas flow) in a passageway. More particularly, the present invention is related to methods of using flow restricting devices and systems having memory foam configured to expand and form conduits around objects disposed in a passageway so that the fluid flow in the passageway is restricted.

2. The Related Technology

Air conditioning systems have long been employed to regulate temperatures within buildings or rooms by generating and blowing heated or cooled air. Usually, the air conditioning system routes forced air through a series of ducts that open into the location needing to be cooled or heated. The air conditioning ducts can include vents and/or vent covers that regulate the amount of air being blown out of each duct. Often, the air conditioning system includes ducts that are pre-installed and are integrated fixtures of a building or room. Air conditioning systems that include ducts with vents and/or vent covers that regulate the air flow are well known in the art.

Recently, data storage facilities have been constructed to house computer equipment containing important data. The data storage facilities typically include at least one air conditioning system to regulate the temperature of the air within the room containing the computer equipment. Usually, the air conditioning system is configured to generate and force cool air into the data storage facility to regulate the temperature of the computer equipment. A data storage facility having a large number of computers may require multiple air conditioning systems in order to regulate the temperature because of the amount of heat produced by the large number of computers. Also, a single air conditioning system may have ducts and vents arranged so that cooled air is blown towards an air inlet of a computer (e.g., front of computer). Often the air conditioning system includes some ducts and vents that blow cool air towards the air outlet of a computer (e.g., back of computer), but the air outlet of the computer releases hot air due to the operation of the computer. The hot air produced by the computer can warm the cool air and render the air conditioning ineffective.

It has recently been found that selectively blowing cooled air toward a computer air inlet and maintaining cool air around the computer air inlet can be more beneficial than maintaining the data storage facility or data storage room housing the computers at a substantially homogenous temperature. Additionally, the cooled air can be prevented from being blown toward the computer air outlets and wasted. Accordingly, temperature gradients that are cooler around the computer air intakes compared to the computer air outlets can be easier and cheaper to maintain, as compared to regulating the temperature so that it is substantially homogenous throughout the data storage facility or data storage room. In part, this is because the computer air intake can receive cooled air and blow hot air out of the computer air outlet. As such, selectively cooling the air around the computer air intake without cooling the heated air around the computer air outlet can provide enhanced cooling without wasting cool air. Attempting to cool the heated air around the computer air outlet is a substantial waste of cooled air. Thus, selectively cooling the air around the computer air intake can be comparatively more cost-effective than standard cooling techniques that cool an entire room to a substantially homogenous temperature.

Additionally, data storage facilities or data storage rooms housing computers have been constructed to utilize air conditioning ducts for passing power cords and data cords between different computers. As such, a large number of cords can be disposed within an air conditioning duct and have one end extend out of a duct opening and connected to a computer and another end extending out of a different duct opening and connected to a different computer. The large number of cords passing through a single air conditioning duct can provide a complex problem when determining the proper endpoints of each cord, rearranging the cords, disconnecting the cords, and reconnecting the cords. Often, the cords emerge from a duct opening, and are plugged into the backs of computers close to the computer air outlet, which can position the computer air outlet in the back of the computer close to the duct opening.

While air conditioning ducts can include vents and vent covers to restrict the flow of cool air towards the computer air outlet, most vents and vent covers are not properly configured to allow cords to be passed therethrough and to restrict the flow of cool air. Additionally, some vents and vent covers may require the cords to be unplugged at one end and routed through the vent or vent cover; however, unplugging a cord or a plurality of cords in a data storage facility can be a daunting activity because of the complex problems associated with determining the proper endpoints of each cord, rearranging the cords, disconnecting the cords, and reconnecting the cords. Thus, the use of such vents and vent covers can have unfavorable consequences and the time required to route the cords through the vents or vent covers can be prohibitive.

Therefore, it would be advantageous to have methods of using a device to selectively restrict the flow of air through air conditioning ducts or from openings in air conditioning ducts. Additionally, it would be advantageous to have methods of using a device to selectively restrict the flow of air through air conditioning ducts containing power cords or data cords being passed therethrough. Further, it would be advantageous to have methods of using a device to retrofit a removable barrier into air conditioning ducts to selectively restrict the flow of air without having to disconnect an end of a cord or plurality of cords that are disposed within the air conditioning duct.

SUMMARY OF THE INVENTION

Generally, the present invention relates to methods of using flow restricting devices and systems that can be used to overcome the foregoing problems in the art. Accordingly, the present invention can include methods of using flow restricting devices and systems that have memory foam for use in restricting the fluid flow in a passageway. As such, the memory foam can be configured to be compressed for insertion into a passageway and to expand within the passageway in order to restrict fluid from flowing through the passageway past the flow restricting device. Also, the memory foam can be configured to self-form conduits around objects disposed in a passageway as the memory foam expands from a compressed state to an expanded state. Also, the memory foam can have portions with features adapted to receive various types of objects so that the memory foam can be compressed to receive the object and expand around the object to form a secure-contoured conduit around the object.

In one embodiment, the present invention can include a method of restricting fluid flow in a passageway having an object disposed therein. Such a method can include the following: inserting a memory foam member in a compressed configuration into the passageway and adjacent to the object so that a receiving portion of the memory foam member receives the object; and expanding the memory foam member to an expanded configuration so that the memory foam member securely fits within the passageway and so that the receiving portion expands around the object thereby self-forming forming a conduit around the object. The compressed configuration of the memory foam member can have a compressed cross-sectional profile that is smaller than a cross-sectional profile of the passageway, and the expanded configuration can have an expanded cross-sectional profile that is the same or larger than the cross-sectional profile of the passageway. Optimally, the cross-sectional profile of the expanded memory foam can fill the passageway. The receiving portion formed into the memory foam can be configured to include a slit, slot, hole, aperture, recess, crease, cavity, collapsible hole, or combination thereof. Also, the receiving portion can self form by expansion of the memory foam. The object can be a flexible tubular member, a power cord, a data cord, a pipe, a deformed portion of the passageway, an electronic device, and the like.

Additionally, the method can include at least one of the following: warming the memory foam member so as to be soft and compressible before the inserting the memory foam into the passageway; cooling the memory foam member after being inserted into the passageway; identifying a passageway in need of restricted fluid flow, wherein the passageway can be capable of passing fluid therethrough and having an object extending through the passageway; compressing the memory foam member to the compressed configuration; inserting the memory foam member into an internal portion of the passageway; inserting the memory foam member at an opening of the passageway; inserting the memory foam into an intersection of the passageway; inserting the memory foam into an opening of a first passageway that intersects a second passageway; inserting the memory foam member with a memory foam applicator; positioning the object at an edge of the passageway; pulling the object taut; inserting the object into the receiving portion; expanding the memory foam so that the object is disposed between an external surface of the memory foam and a perimeter of the passageway and the like.

In one embodiment, the memory foam member can include a body comprised of memory foam having an expanded shape and size that securely fits within the passageway so as to restrict, inhibit, or terminate fluid flow through the passageway. The memory foam can have a receiving portion extending from a first end to a second end. The receiving portion can be configured for receiving an object that extends from the first end to the second end so that a conduit is formed around the object by expanding the memory foam around the object. The memory foam member can further include any of the following: an elongated body; a water-scavenger; an anti-static component; a coating; a coating having a water scavenger; a coating having an antistatic components; a sealant coating; a water-resistant coating; a fire-retardant coating; a friction coating; a means of protecting the memory foam member; an adhesive on an external surface; an adhesive on an external surface having a peelable cover; a handle, a memory foam handle; a retrieving member; a retractable retrieving member; a retrieving member coupled to an anchor; a retrieving member coupled to a fastener; a retrieving member coupled to a lockable fastener; a means for removing the memory foam member from the passageway; an internal cavity, an internal cavity comprising an electronic device; an internal cavity comprising a thermocouple; an internal cavity comprising an inflatable bladder; an accessible cavity; or the like.

In one embodiment, the present invention can include a method of restricting fluid flow in a passageway having an object extending therethrough. The method can include the following: inserting a housing into the passageway so that the housing fits securely within the passageway and the object extends through a chamber defined by a body of the housing; inserting the memory foam member in a compressed configuration into the chamber and adjacent to the object so that a receiving portion of the memory foam member receives the object; and expanding the memory foam member to an expanded configuration so that the memory foam securely fits within the chamber and so that the receiving portion expands around the object thereby self-forming a conduit around the object. The compressed configuration of the memory foam member can have compressed cross-sectional profile that is smaller than a cross-sectional profile of the housing, and the expanded configuration has an expanded cross-sectional profile that is the same or larger than the cross-sectional profile of the housing. Optionally, the memory foam member can have a solid cross-sectional profile before and/or after being compressed and/or expanded. Also, the receiving portion can be configured to include a slit, slot, hole, aperture, recess, crease, cavity, collapsible hole, or combination thereof. Further, the housing can have a separable portion extending from a first end to a second end, wherein the separable portion divides a first portion of the housing from a second portion of the housing and the first portion is capable of separating from the second portion to open the housing. Furthermore, the housing can include a hinge so that actuation of the hinge separates the first portion of the housing from the second portion of the housing. Optionally, the housing can include a first fastener and a second fastener, so that the first fastener and second fastener can fasten together to couple the first portion of the housing with the second portion of the housing.

Additionally, the method can include at least one of the following: expanding the memory foam so that the object is disposed between an external surface of the memory foam and a perimeter of the passageway; warming the memory foam member so as to be soft and compressible before the inserting the memory foam into the chamber; cooling the memory foam member after being inserted into the chamber; positioning the housing at an opening of the passageway so that a first end of the housing is disposed at the opening of the passageway so that an outwardly projecting lip of the first end of the housing outwardly projects from the opening, wherein the projecting lip prevents the first end of the housing from entering into the passageway; positioning the memory foam member in the chamber so that the expanded memory foam member is disposed on a shelf, wherein the housing has a second end having an inwardly projecting shelf at least partially defining the chamber; opening the housing so as to open the chamber; placing the housing around the object so that the object is disposed within the opened chamber; closing the housing so that the chamber is closed around the object; opening a separable portion of the housing so as to separate the first portion from the second portion to open the housing; inserting the object into the opened chamber; closing the separable portion so as to adjoin the first portion with the second portion to close the housing around the object.

These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings, in which:

FIG. 9 is side view of an embodiment of a memory foam member having a handle.

FIG. 10 is side view of an embodiment of a memory foam member having handles anchored into the memory foam.

FIG. 12 is side view of an embodiment of a memory foam member having a retrieving member coupled to a compressing member.

DETAILED DESCRIPTION OF THE PREFERRED EMBODIMENTS

Figure 1:
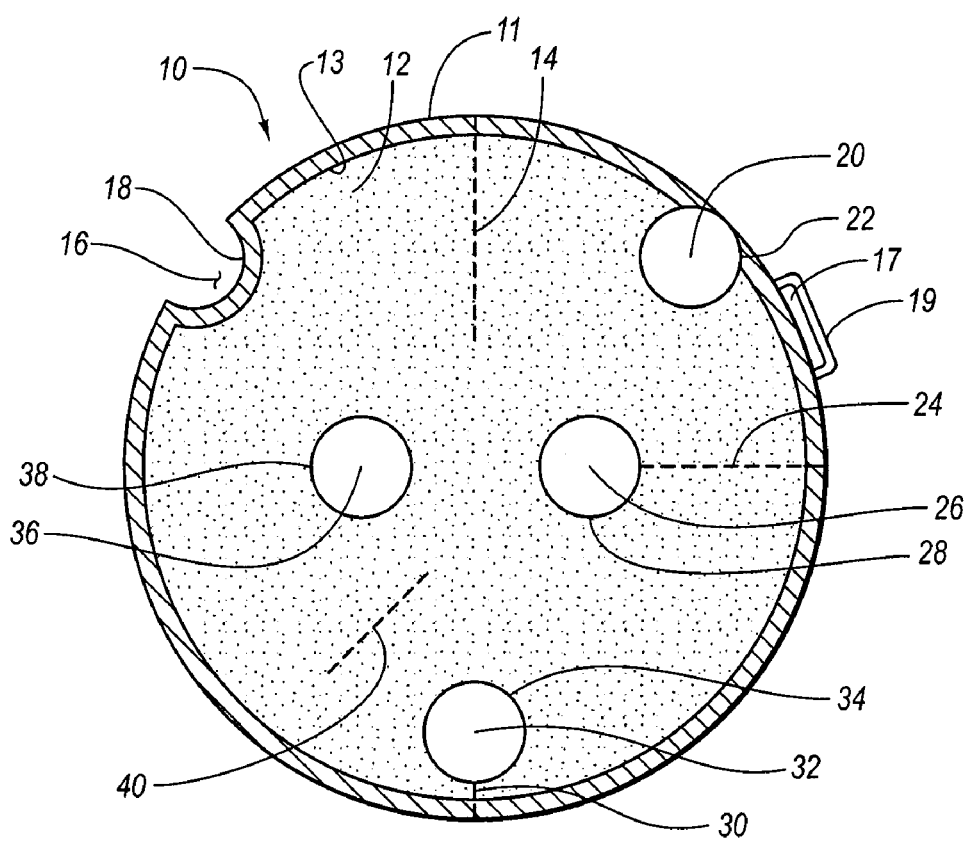
FIG. 1 is a cross-sectional profile illustrating an embodiment of a device having memory foam configured to self-form conduits around objects extending therethrough.

Generally, the present includes methods of using fluid flow restricting devices and systems that have memory foam to restrict the fluid flow in a passageway. The fluid flow restricting devices and systems can be configured for restricting, inhibiting or stopping the flow of a fluid, such as a liquid, or a gas, through the passageway. The passageway can be exemplified by a duct, plenum, hole, gap, aperture, vent, inlet, outlet, or the like, all of which can be used interchangeably in describing the flow restricting device. As such, the memory foam can be configured to expand within a passageway in order to restrict fluid from flowing through the passageway past the flow restricting device. Also, the memory foam can be configured to self-form conduits around objects disposed in a passageway when the memory foam expands from a compressed state to an expanded state. Also, the memory foam can have portions comprised of features adapted to receive various types of objects so that the memory foam can be compressed to receive the object and expand around the object to form a secure-contoured conduit around the object.

In one embodiment, the present invention can include using a flow restricting device to restrict fluid flow through a passageway, such as an air conditioning vent or conduit. Such a flow restricting device can include a memory foam member having a body defined by a first end and a second end and at least one external wall extending therebetween. The body of the expanded memory foam can have a cross-sectional profile with a shape that ranges from circular to polygonal. Also, the expanded shape and size of the memory foam can securely fit within the passageway so as to restrict, inhibit, or stop fluid flow through the passageway. Additionally, the memory foam can have a receiving portion that extends from the first end to the second end that is configured for receiving an object that extends from the first end to the second end through the passageway. The receiving portion can have various configurations and can include internal portions and/or external portions of the memory foam. The receiving portion can self-form a conduit around the object by expanding the memory foam around the object.

In one embodiment, the flow restricting device for restricting fluid flow through a passageway can include a housing containing a memory foam member. The housing can include a body at least partially defining a chamber. As such, the chamber can have at least one wall that is open or the chamber can be defined by a combination of the housing body and another member. Optionally, the housing can be formed by one body or multiple bodies that are coupled and cooperate to form the housing. Also, the housing body can be configured to fit within the passageway. The memory foam can be disposed in the chamber of the housing so as to restrict fluid flow through the passageway. The memory foam can have a first end, a second end, and a receiving portion configured for receiving an object that extends from the first end to the second end. The receiving portion can self-form a conduit around the object by expanding the memory foam around the object.

In one embodiment, the present invention can include a flow restricting system for restricting fluid flow through a passageway. Such a system can include a housing and a piece of memory foam configured to be secured to or placed in the housing. The housing can include a body at least partially defining a chamber, and the body can be configured to fit within the passageway. The memory foam can have a first end, a second end, and an expanded shape and size that allow the memory foam to securely fit within the chamber so as to restrict fluid flow through the passageway. The memory foam can have a receiving portion configured for receiving an object that extends from the first end to the second end so that a conduit is formed around the object by expanding the memory foam around the object.

Additionally, the receiving portion that expands to self-form the conduit can be selected from the group consisting of an external surface, a slit, hole, aperture, recess, cavity, collapsible hole, combinations thereof, and the like. Also, the receiving portion can be shaped and sized so as to receive a variety of objects that can be used within a passageway or extend through the passageway. For example, the object can be a flexible tubular member such as power cords, electronic communication cords, phone lines, fiber optic cords, pipes, a deformed portion of the passageway, an electronic device, and the like.

In one embodiment, the memory foam can be configured to be fire-retardant or fire-proof. That is, the memory foam can include compounds that retard or completely inhibit the ability of the memory foam to catch and sustain fire. This can be beneficial when the device is used in passageways that are exposed to heat, sparks, flames or other fire-starting conditions.

Additionally, the housing can have various configurations. As such, the housing can include a first end having an outwardly and/or inwardly projecting lip. Also, the housing can have a second end having an inwardly projecting shelf.

In one embodiment, the housing can be configured to open so as to open the chamber. A first portion of the housing can have a separable portion extending from a first end to a second end. The separable portion can divide a first portion of the housing from a second portion of the housing, and the first portion can be capable of separating from the second portion to open the housing. Further, the housing can include a second wall having a hinge so that actuation of the hinge separates the first portion of the housing from the second portion of the housing. Furthermore, the first portion can include a first fastener and the second portion can include a second fastener. The first fastener and second fastener can be configured to fasten together in order to couple the first portion of the housing with the second portion of the housing. For example, the first fastener can be a male fastener and the second fastener can be a female fastener so that the male fastener is received into the female fastener in order to couple the first portion with the second portion to form a continuous housing. Furthermore, the housing can be made of a flexible material with an opening, so that the housing can flex to open the chamber and be relaxed to close the chamber. Alternatively, the housing can be formed of multiple coupled members that can be coupled and/or separated from each other. Optionally, the closed housing can be secured in the closed position.

I. Introduction

Accordingly, an embodiment of the invention can include a flow restricting device having memory foam configured for removable placement as a barrier within a fluid passageway to restrict fluid flow. While the present flow restricting device can be configured to restrict the flow of liquids and gasses, a preferred embodiment is configured for restricting airflow. Accordingly, any reference herein to an airflow restricting device should be construed to cover a liquid flow restricting device.

The memory foam of a flow restricting device can be any foam that can return to its original shape after being compressed. The memory foam can be configured so that objects, such as cords, tubes, wires, fibers, and the like, can extend through the passageway before placement of the memory foam. The expanding memory foam can then self-form conduits around the objects after the memory foam has been placed and expanded within the passageway. The memory foam can have an expanded cross-sectional profile that is larger than the cross-sectional profile of the passageway so that compression of the memory foam enables placement into the passageway and expansion of the memory foam causes a secure fit within the passageway. As the memory foam expands towards the fully expanded state, the memory foam can form a barrier having a shape that corresponds with the cross-sectional profile of the passageway. During the expansion, any objects that extend through the passageway can cause conduits to be formed therearound by the memory foam. This can include conduits at the edge of the memory foam adjacent to the internal surface or perimeter of the passageway, and conduits that extend through the body of the memory foam.

For example, one embodiment of the flow restricting device can include memory foam having a shape and size that can be compressed so as to fit within a passageway and is capable of expanding so as to form a barrier that restricts, inhibits, or stops the flow of fluid through the passageway. Additionally, the memory foam can expand to conform around any irregularities existing within the passageway. In the instance objects, such as cords, tubes, wires, fibers, and the like, extend through, or are disposed in, the passageway, the expanding foam can press up against such objects so as to self-form conduits around the objects. The memory foam having the self-formed conduit can significantly inhibit or stop fluid flow in the passageway or between the object and the memory foam. In some instances, the memory foam can form a barrier that substantially seals the passageway with or without the self-forming conduits sealed around the objects extending therethrough.

In another example, the memory foam can have slits, recesses, cavities, apertures, or other like features that can be used for receiving the objects or passing the foregoing objects therethrough before allowing the foam to expand. Additionally, such features can be formed into the memory foam by compressing or otherwise deforming the foam. In the instance of slits along the length of the foam, which generally extend from the surface of the foam to an interior position, the walls that define the slit can be separated and placed around the objects. When the foam expands, the walls can seal the slits to the objects so as to form conduits around the objects. In the instance of recesses, which generally have cross-sectional profiles that are smaller than the objects, the walls that define the recess can compress against the objects along the length thereof to form the conduit as the memory foam expands. In the instance of cavities, bulky objects can be placed therein so that expansion of the memory foam conforms to the cavity to the object. In the instance of apertures, which generally extend across the longitudinal length of the airflow restricting device, objects can be passed therethrough before compression and/or expansion of the foam so that expansion of the memory foam presses the walls of the aperture against the object in order to form the conduit. Also, the conduits can be formed around multiple objects that are separate or multiple objects grouped together in a single conduit.

In another example, the flow restricting device can have a housing with a lumen and/or chamber adapted for receiving the memory foam. The housing can have a shape and size that is configured to correspond with the cross-sectional profile of the passageway so as to securely fit therein. Accordingly, the memory foam can be received into the lumen and/or chamber and compressed such that an object can be passed through the lumen and/or chamber in order for the expanding memory foam to self-form a conduit around the object as the foam expands. In some instances, the memory foam is selectively coupled with the housing (e.g., at the luminal wall of the housing) or otherwise held by the housing.

II. Memory Foam

In accordance with the present invention, memory foam can be utilized to restrict fluid flow in a passageway, and to allow objects disposed in the passageway to extend past the memory foam. As used herein, the term "memory foam" is meant to refer to any open cell and/or closed cell foam having a relaxed, expanded state to which the foam returns after being compressed and released from compression. That is, the memory foam automatically attempts to return to the expanded state after being compressed. During the attempt to return to the expanded state, the memory foam can interact with objects that provide resistance against the expanding foam, thereby preventing the foam from expanding past the object. In the instance the memory foam expands against an object, the object can cause the memory foam to expand so as to conform to the shape of the object. Thus, the ability of memory foam to expand and conform in shape and size to objects has now been found to be useful for restricting fluid flow in passageways where objects are disposed by allowing compressed memory foam to expand to conform to the shape of the passageway to conform to the shape of and any objects located within the passageway.

Briefly, memory foam can be made from polymers, such as polyurethane, and additional chemicals that crosslink the polymers and/or add to the viscosity level of the to as viscoelastic foam. The properties of memory foam, such as compressibility and/or expandability, can be altered by the additional chemicals used to process the memory foam and/or the overall density of the memory foam. For example, memory foam can be configured to become firmer when exposed to cooler temperatures and can become softer when exposed to warmer temperatures. Usually, the temperature sensitivity of the memory foam is conditioned for use in room temperature and to respond to heat provided by contact with skin, such as human skin. Higher density memory foam can be configured to respond to body heat and allow the memory foam to mold itself to the shape of a warm body, such as a hand, within a few minutes. Additionally, lower density memory foam can be configured to be pressure-sensitive and can mold more quickly to the shape of the body, such as by a hand compressing the memory foam. Thus, any foam or any composition that can be compressed into a compressed configuration and expanded to an expanded configuration can be considered memory foam under the present invention.

In one embodiment, the memory foam can be temperature sensitive. That is, the memory foam can have a change in chemical and/or physical properties when heated or cooled from a base temperature. Usually, the base temperature is room temperature, which is standard to be about 25° C. As such, the memory foam can soften when heated to a temperature range within about 25° C. of the base temperature, such as when in contact with human skin. Also, the memory foam can harden when cooled to a temperature range within about 25° C. of the base temperature, such as when cooling air is blown against the foam when in an air conditioning duct.

The memory foam can be comprised of various types of thermoplastic materials. Some examples of suitable thermoplastic materials can include polyvinylchlorides ("PVC"), polyolefins, polyethylenes, polypropylenes, styrene-butadienes, styrene-isoprenes, polyesters, polyurethanes, polyamides, combinations thereof, and the like. In any event, any type of material that can be fashioned into memory foam that can function as described herein can be used in the present invention.

In one embodiment, the memory foam can be an open cell foam. An open cell foam can be advantageously used when the environment in which the barrier is formed can permit at least some amount of fluid to flow past the memory foam. For example, an open cell memory foam can be used in an air conditioning duct when the flow merely needs to be partially restricted. In another example, an open cell memory foam can be used in an opening of an air conditioning duct in order to occlude the opening and to allow at least some air to pass through the memory foam.

In one embodiment, the memory foam can be a closed cell foam. A closed cell foam can be advantageously used when the environment in which the barrier is formed would preferably inhibit at least some amount of fluid from flowing past the memory foam. For example, a closed cell memory foam can be used in an air conditioning duct when the flow merely needs to be substantially restricted. In another example, a closed cell memory foam can be used in an opening of an air conditioning duct in order to occlude the opening and inhibit at least some air from passing through the memory foam.

In one embodiment, the memory foam can include a coating. The coating can be a polymeric coating, such as polyethylene or the like, that coats the external surface of the memory foam member so as to conform to the external surface. Examples of such a coating materials that can be applied to the memory foam can include vinyl-based polymeric coatings, water-based coatings, acrylic coatings, polyurethane coatings, aluminized coatings, chlorosulfonated polyethylene coatings, polyethylene coatings, polypropylene coatings, and the like. As such, coating can be hydrophobic or hydrophilic. The coating can be dried onto the memory foam to remove solvents (e.g., water) to provide a durable coating. Accordingly, the coating can be affixed against the external surface of the memory foam while the memory foam member is compressed to a compressed configuration and/or expanded to an expanded configuration. As such, the coating can be used to protect the memory foam during use. This can include a coating having a water scavenger, a coating having an antistatic component, a sealant coating, a water-resistant coating, a hydrophobic coating, a fire-retardant coating, and other coatings that function to protect the memory foam. Also, the coating can be configured to be aesthetically pleasing by including pigments or materials that have an illustrious appearance. Coatings that protect foam or provide aesthetically pleasing qualities are well known in the art. [Note: Please provide a list of preferred materials to be used as coatings.]

In one embodiment, the coating can be a friction coating that provides friction between the memory foam and the passageway wall. A friction coating can be prepared by coating the memory foam with a material that provides a rough or fictional surface. The friction can be achieved by forming irregular elevations on the coating that can function to resist sliding against the passageway wall. Accordingly, the coating can include abrasive particles, rough particles, or the like to provide friction. Alternatively a friction coating can be prepared by a material such as rubber, elastomers, plastomers, or latexes, that grips against the passageway to inhibit sliding.

In one embodiment, the memory foam can be configured to conform to standards or regulations for a particular use. From time-to-time various regulatory entities (e.g., government) or consumer-safety entities (e.g., Underwriters Laboratories ("UL") implement standards or regulations with which a product needs to comply in order to be used for a particular purpose. As such, the memory foam can be configured to comply with such standards. In some instances the memory foam can be used in heating or cooling ducts in various types of buildings or with respect to various environments. As such, a specific use of the memory foam may have rules or regulations governing certain standards that materials need to comply with in order to be used therein. For example, air conditioning systems may require memory foam to have certain safety-related properties in order to be used as a barrier within an air conditioning duct, where the memory foam may need to have a certain level of fire-resistance to be used therein.

In one embodiment, the memory foam can be fire-resistant or fire-retardant. As such, the memory foam can be prepared and/or processed in a manner so that the memory foam resists and/or prevents catching fire. This can be accomplished by selection of the types of materials used in preparing the memory foam and/or the conditions under which the memory foam is prepared. For example, the memory foam can be prepared from a polymer that is fire-resistant.

In one embodiment, the memory foam can include or be impregnated with a material that is fire-resistant or fire-retardant in order to provide such a property to the memory foam. For example, such chemicals can include polybrominated diphenyl ethers, melamine, Tris (1,3-dichloro-2-propyl) phosphate ("TDCPP"), ammonium polyphosphate, and the like. In any event, any type of fire-resistant or fire-retardant materials that can be incorporated into memory foam to function as described herein can be used in the present invention.

In one embodiment, the memory foam body or coating of the present invention can include antistatic materials. The use of antistatic materials in the memory foam body or coating can inhibit the generation of static electricity when the memory foam member is being inserted into the passageway or while residing within the passageway. This may be important because of the static-sensitive electronic equipment associated with data storage facilities. The antistatic material can by any type of material that inhibits the formation of static electricity by being electrically non-conductive, or being an electron scavenger. For example, the antistatic material can be selected from the group consisting of polytetrafluoroethylene ("PTFE"), fluorinated ethylene-propylene polymer ("FEP"), carbon-filled polymer, glycerolmonostearate, ethoxylated alkylamine, nonionic ethoxylated alkylamine, lauric diethanol amine, alkyl sulfonates, alkyl dimethyl benzyl ammonium chloride/bromide, anionic aliphatic sulfonate/phosphates, quaternary ammonium compounds, glass-impregnated polystyrene, glass-impregnated acrylonitrile butadiene styrene polymers, antistatic polycarbonate, cationic scavengers, and combinations thereof. Additionally, in some instances it can be preferred for the antistatic material to be selected from the group consisting of polytetrafluoroethylene, fluorinated ethylene-propylene polymer, carbon-filled polymer, glycerolmonostearate, ethoxylated alkylamine, and combinations thereof. The antistatic material can be present at from about 0.005% to about 49% by weight, more preferably from about 0.05% to about 39% by weight, and most preferably from about 1% to about 29% by weight of the memory foam.

In one embodiment, a hygroscopic material, also referred to as a water-scavenger component, can be included memory foam body or coating of the present invention. Optionally, the hygroscopic material can be present in an amount and distribution so as to absorb water that may permeate into the memory foam or coating. The presence of a hygroscopic material can serve to bind excess water, and can also be a supplemental antistatic agent or can inhibit detrimental effects of water within an air conditioning duct of a data storage facility. In part, this is because water bound within the hygroscopic material may be inhibited from contributed to the generation of static electricity and/or can keep the conductivity relatively constant. Also, the use of a hygroscopic material can allow for the memory foam body or coating to be maintained reasonably independent of the humidity or avoid detrimental effects associated with humidity. Moreover, the hygroscopic material can inhibit degradation of the memory foam body or coating over time and/or in response to environmental conditions. The hygroscopic material can by any material that binds and retains water. In some instances it can be preferred for the hygroscopic material to be a hydroscopic scavenger. For example, the hygroscopic scavenger can be selected from the group consisting of phosphorous pentoxide, ethanol, methanol, glycerin, sodium hydroxide, $H_2SO_4$, $ZnSO_4$, $CaCl_2$, $SiO_2$, $NaNO_3$, $CaSO_4$, combinations thereof and the like. The hygroscopic material can be present at from about 0.005% to about 10% by weight, more preferably from about 0.05% to about 5% by weight, and most preferably from about 0.1% to about 2.5% by weight.

III. Memory Foam Configurations

The present invention can use memory foam of various shapes, sizes, densities and/or other properties. While selected shapes and configurations of memory foam in accordance with the present invention are depicted and described in connection with the figures, it should be recognized that these are merely illustrations of some examples of the present invention. Also, each element of the memory foam devices illustrated in the figures can be combined or separated as desired. As such, the present invention can extend to other shapes and configurations consistent with the teachings provided herein.

FIG. 1 is a cross-sectional view of a piece of memory foam 10. The memory foam 10 has a shape and size defined by a body 12, which has a substantially circular cross-sectional profile. The body 12 of the memory foam 10 can include an external surface 13 that is designed to contact a circular inner surface of a passageway after expansion of the memory foam 10. However, other shapes can be used that correspond with the shape of a passageway.

As shown, the memory foam 10 can optionally include a coating 15 on the external surface 13. Accordingly, the coating 15 can be configured to be water-resistant, antistatic, or include other properties that protect the memory foam 10. The coating 15 can thereby provide a protective surface 11 to the memory foam 10.

In another option, the memory foam 10 can include an adhesive layer 17 on the external surface 13 or protective surface 11. The adhesive layer 17 can be used for affixing the memory foam 10 to the passageway or housing disposed within the passageway. Also, the adhesive layer 17 can be overlaid with a peelable layer 19, which can protect the adhesive layer 17 until used. Adhesives and corresponding peelable layers are well known in the art.

In one embodiment, the memory foam 10 can include a slit 14 extending from the external surface 13 into the body 12 of the memory foam 10. The slit 14 can be separated at the external surface 13 and opened so as to form a receiving portion of the memory foam 10. As such, the slit 14 can be opened so that each side of the body 12 around the slit 14 is compressed and an object can be placed within the opened slit 14. After the object is placed in the slit 14, the memory foam 10 can be expanded so as to self-form a conduit around the object disposed in the slit 14. As such, a slit 14 can be used as a self-forming conduit.

In one embodiment, the memory foam 10 can include a recess 16 defined by a recess wall 18 at the external surface 13. The recess 16 can be formed and/or enlarged by compressing the body 12 of the memory foam 10 at the recess wall 18. As such, the recess wall 18 can be manipulated so that the recess 16 is opened so as to form a receiving portion of the memory foam 10. As such, the recess 16 can be opened so that the body 12 adjacent to the recess wall 18 is compressed and an object can be placed within the recess 16. After the object is placed in the recess 16, the memory foam 10 can be expanded so as to self-form a conduit around the object that is disposed in the recess 16. As such, a recess 16 at the external surface 13 can be used as a self-forming conduit. While the recess 16 can be cut or otherwise shaped into the external surface 13 of the memory foam 10, the recess 16 can be formed by merely compressing the memory foam 10 so that full expansion results in the recess 16 being filled with expanding foam.

In one embodiment, the memory foam 10 can include a cavity 20 defined by a cavity wall 22. The cavity 20 can be disposed within the body 12 of the memory foam 10 and/or adjacent to the external surface 13. The cavity 20 can be enlarged by compressing the body 12 of the memory foam 10 at the cavity wall 22. Also, the cavity 20 can be opened by tearing the cavity wall 22 at the external surface 13 of the memory foam. In any event, the cavity wall 22 can be manipulated so that the cavity 20 is enlarged and/or opened so as to form a receiving portion of the memory foam 10. As such, the cavity 20 can be enlarged and/or opened so that the body 12 adjacent to the cavity wall 22 is compressed and an object can be placed within the cavity. After the object is placed in the cavity 20, the memory foam 10 can be expanded so as to self-form a conduit around the object that is disposed in the cavity 20. As such, a cavity 20 adjacent to the external surface 13 can be used as a self-forming conduit.

In one embodiment, the memory foam 10 can include an internal cavity 26 defined by an internal cavity wall 28. The internal cavity 26 can be disposed within the interior of the body 12 of the memory foam 10. The internal cavity 26 can be accessed from the external surface 13 by including a cavity slit 24 that extends from the external surface 13 to the internal cavity 26. As such, the internal cavity 26 can be opened by separating the cavity slit 24 at the external surface 13 and opening the cavity slit 24 to access the internal cavity 26 so as to form a receiving portion of the memory foam 10. As such, the cavity slit 24 can be opened so that each side of the body 12 around the cavity slit 24 is compressed and an object can be passed therethrough and into the internal cavity 26. The internal cavity 26 can be enlarged by compressing the body 12 of the memory foam 10 at the internal cavity wall 28. In any event, the cavity slit 24 and internal cavity wall 22 can be manipulated so that the internal cavity 26 is enlarged and/or opened so as to form a receiving portion of the memory foam 10. As such, the internal cavity 26 can be enlarged and the cavity slit 24 can be opened so that the body 12 adjacent to the internal cavity wall 28 and cavity slit 24 is compressed and an object can be placed within the internal cavity 26. After the object is placed in the internal cavity 26, the memory foam 10 can be expanded so as to self-form a conduit around the object that is disposed in the internal cavity 26. As such, an internal cavity 26 that can be opened to the external surface 13 can be used as a self-forming conduit.

In one embodiment, the memory foam 10 can include a hole 32 defined by hole wall 34. The hole 32 can be disposed within the body 12 of the memory foam 10. The hole 32 can be accessed from the external surface 13 by including a hole slit 30 that extends from the external surface 13 to the hole 32. As such, the hole 32 can be opened by separating the hole slit 30 at the external surface 13 and opening the hole slit 30 to access the hole 32 so as to form a receiving portion of the memory foam 10. As such, the hole 32 can be opened so that each side of the body 12 around the hole slit 30 is compressed and an object can be passed therethrough and into the hole 32. The hole 32 can be enlarged by compressing the body 12 of the memory foam 10 at the hole wall 34. In any event, the hole 32 and hole wall 34 can be manipulated so that the hole 32 is enlarged and/or opened so as to form a receiving portion of the memory foam 10. As such, the hole 32 can be enlarged and the hole slit 30 can be opened so that the body 12 adjacent to the hole wall 34 and hole slit 30 are compressed and an object can be placed within the internal cavity 26. After the object is placed in the hole 32, the memory foam 10 can be expanded so as to self-form a conduit around the object that is disposed in the hole 32. As such, a hole 32 that can be opened to the external surface 13 can be used as a self-forming conduit.

In one embodiment, the memory foam 10 can include an aperture 36 defined by an aperture wall 38. The aperture 36 can be disposed within the body 12 of the memory foam 10. The aperture 36 can be enlarged by compressing the body 12 of the memory foam 10 around the aperture wall 38. In any event, the aperture 36 and aperture wall 38 can be manipulated so that the aperture 36 is enlarged so as to form a receiving portion of the memory foam 10. As such, the aperture 36 can be enlarged so that the body 12 adjacent to the aperture wall 38 is compressed and an object can be placed within the aperture 36. After the object is placed in the aperture 36, the memory foam 10 can be expanded so as to self-form a conduit around the object that is disposed in the aperture 36. As such, an aperture 36 can be used as a self-forming conduit.

In one embodiment, the memory foam 10 can include a collapsible hole 40 disposed within the body 12 of the memory foam 10. The collapsible hole 40 can be substantially similar to the foregoing slit 14; however, the collapsible hole 40 is disposed internally within the body 12 of the memory foam 10 and does not extend to the external surface 13. The collapsible hole 40 can be separated and opened so as to form a receiving portion of the memory foam 10. As such, the collapsible hole 40 can be opened so that each side of the body 12 around the collapsible hole 40 is compressed and an object can be placed within the collapsible hole 40. For example, the collapsible hole 40 in the opened orientation can be substantially as the aperture 36 described above. After the object is placed in the collapsible hole 40, the memory foam 10 can be expanded so as to self-form a conduit around the object disposed in the collapsible hole 40. As such, a collapsible hole 40 can be used as a self-forming conduit.

FIG. 9 illustrates an embodiment of a memory foam member 300 that can be easily inserted and/or removed from a passageway. Accordingly, the memory foam member 300 can include a body 302 having a first end 304 and a second end 306. The memory foam member 300 can include a handle 308 that can be gripped during insertion and/or removal of the memory foam member with respect to the passageway. Preferably, the handle 308 is ergonomic and has contours for receiving a hand. The handle 308 can be prepared from any material, such as foams, memory foams, plastics, composites, metal, natural fibers, and the like. The handle 308 can be connected to the body 302 or intimately associated therewith. Preferably, the handle 308 is comprised of memory foam and extends from the body. Thus, the handle 308 can be associated or integral with the body 302 of the memory foam member 300 as is well known in the art.

Optionally, the memory foam member 300 can include an internal cavity 307. The internal cavity 307 can be configured for containing an object therein, such as an electronic device, thermocouple, inflatable bladder, a rigid member, or the like. Also, the internal cavity 307 can be empty or filled with a fluid. The body 302 can include a slit 309 that allows for access into the cavity 307. This can allow for objects to be placed in the cavity 307 or removed therefrom before and/or after being inserted into a passageway.

FIG. 10 illustrates another embodiment of a memory foam member 310 that can be easily inserted and/or removed from a passageway. Accordingly, the memory foam member 310 can include a body 312 having a first end 314 and a second end 316. The memory foam member 310 can also include at least one retrieving member 318, and can include two oppositely opposed retrieving members 318a, 318b. The retrieving members 318a, 318b can be configured similarly to handles so as to be used for retrieving the memory foam member 310 from a passageway. Accordingly, the retrieving members 318a, 318b can be tabs, arms, bails, grasps, grips, knobs, or the like that are affixed to the body 312 of the memory foam member 310.

Optionally, the retrieving members 318a, 318b can be anchored into the body 312 of the memory foam member 310 by anchors 319a, 319b. The anchors 319a, 319b can be in any configuration or position with respect to the body 312 of the memory foam member 310 that secures the retrieving members 318a, 318b thereto. In one embodiment, at least one of the retrieving members 318a, 318b can be coupled to the memory foam member 310 via the anchors 319a, 319b after being disposed within the passageway, but before the memory foam member 310 is removed therefrom. Thus, the anchors 319a, 319b can provide fore the retrieving members to be selectively couplable and removable from the memory foam member 310.

Figure 11:
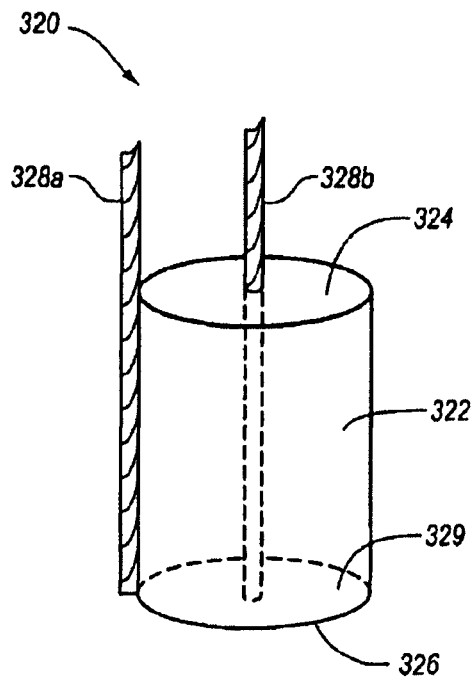
FIG. 11 is side view of an embodiment of a memory foam member having at least one retrieving member.

FIG. 11 illustrates another embodiment of a memory foam member 320 that can be easily inserted and/or removed from a passageway. Accordingly, the memory foam member 320 can include a body 322 having a first end 324 and a second end 326. The body 322 of the memory foam member 320 can include a retrieving member 328a coupled to the exterior surface, and/or a retrieving member 328b extending from within the body 322 of the memory foam member 320. As shown, the retrieving members 328a, 328b can be configured as cords, rope, twine, wire, fibers, or other elongate members that can extend away from the memory foam member 320. Optionally, the retrieving members 328a, 328b can be coupled to the memory foam member 320 at various positions, such as at the second end 326 which is configured to include an end plate 329 coupled to at least one of the retrieving members 328a, 328b.

FIG. 12 illustrates another embodiment of a memory foam member 330 that can be easily inserted and/or removed from a passageway and selectively expanded or contracted therein. Accordingly, the memory foam member 330 can include a body 332 having a first end 334 and a second end 336. The memory foam member 330 can also include a band 338. The band 338 can be disposed on the external surface of the memory foam member 330 or imbedded therein. While the band 338 is shown to have a smaller length than the memory foam member 330, it can be any size in relation thereto, such as about, 25%, 50%, and 100%. The band 338 can be made of a pliable or flexible material that can conform with the shape of the memory foam member 330. The band 338 can be configured for holding the memory foam member 330 in a contracted configuration, or can be configured for contracting the memory foam member. For example, the band 338 can be contracted so as to hold memory foam member 330 in a contracted position by applying a force to the band, or be expanded to as to expand the memory foam member by releasing a force from the band.

Additionally, the band 338 can be coupled to one or more contracting cords 340 that can be pulled to contract the band around the memory foam member 330 or relaxed to expand memory foam member. The cords 340 can be disposed within or pass through the body 332 of the memory foam member (as shown), or can pass around the external surface. The cords 340 can be coupled at the opposite end to a retrieving member 342. As shown, the cords 340 can be coupled to the retrieving member 342 at a central axis of the first end 334. Optionally, the cords 340 can be selectively decoupled from the retrieving member 342 in order to selectively expand the band 338 and the memory foam member 330. Also, the band 338 can be configured to selectively expand the memory foam member by being activated. The band 338 can be activated by one of the cords 340 in order to cause expansion. For example, a cord 340 can be coupled to an affixing member (not shown), such as velcro, disposed on the band 338 so that decoupling the affixing member can allow the memory foam member 330 to expand. Optionally, the band 338 can be removably coupled with the memory foam member 330 so that the band can be removed therefrom in order to allow expansion.

Optionally, the retrieving member 342 can be coupled at the opposite end to a fastener 344. As shown, the fastener 344 can include a hook 346 and closing element 348. The fastener 344 can be useful for securing the memory foam member 330 to external member that is part of the passageway or proximate thereto. Often, external members can be anchored, attached, proximal, and/or adjacent to the bodies that form the passageway. Accordingly, the fastener 344 can be selectively coupled to the external member so as to secure the memory foam member 330 within the passageway. This can be beneficial when the memory foam member 330 is inserted into the passageway while in the contracted configuration so that the fastener 344 can be secured to an external member in order for the expanding memory foam member to be retained at a position within the passageway. For example, the hook 346 can be hooked into an external member, such as a hole, and then secured by actuating the closing element 348. The memory foam member 330 can then be lowered into a passageway and held in place by the fastener 344 and retrieving member 342 before being expanding by activating the band 338.

Figure 13:
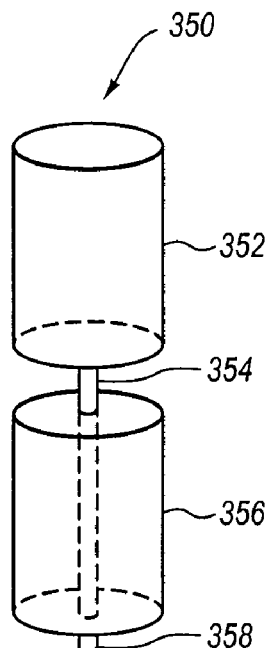
FIG. 13 is a side view of an embodiment of a device comprised of modular memory foam members that are movably coupled together.

As shown in FIG. 13, one embodiment of the present invention can include a modular memory foam device 350. The modular device 350 can be modular by including a plurality of memory foam members 352, 356, 360 that are linked together. While the memory foam members 352, 356, 360 are shown to be linked together via cords 354, 358, other means can be used that allow the memory foam members to move relative to each other. Also, the memory foam members 352, 356, 360 can have the same or different shapes and/or sizes. The modular device 350 can be useful for passageways that include junctions, intersections, or different cross-sectional profiles at adjacent positions. Also, the memory foam members 352, 356, 360 can be selectively expanded together or separately.

Figures 14A, 14B:
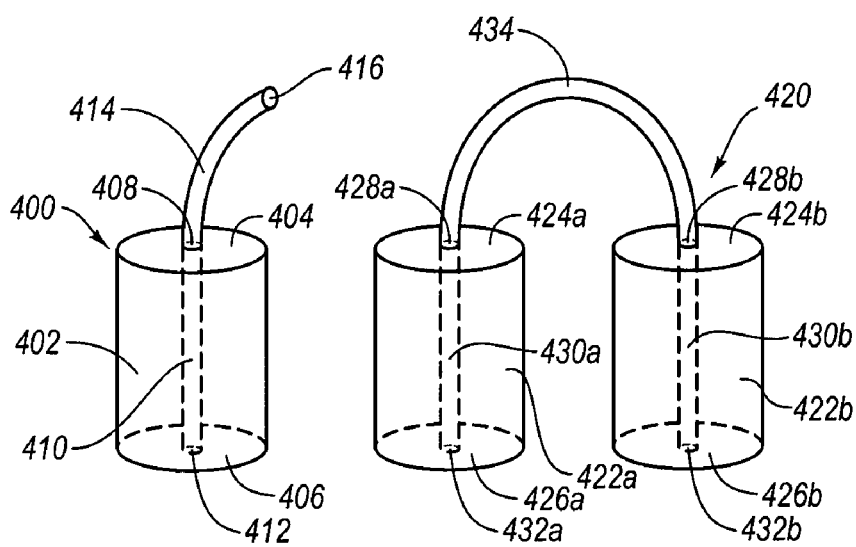
FIGS. 14A-14B are side view of embodiments of a device comprised of memory foam members configured to redirect fluid flow from the passageway.

FIGS. 14A-14B illustrates additional embodiments the present invention that can include a memory foam device 400 having a fluid flow router 414. With respect to FIG. 14A, the memory foam device 400 can include a body 402 having a first end 404 and a second end 406. As shown, the fluid flow router 414 can be coupled to a lumen 410 that extends from a first opening 408 in the first end 404 to a second opening 412 in the second end 406. The fluid flow router 414 can include a flow opening 416 that can be selectively positioned so that fluid flowing through the passageway can be routed to a selected area. The fluid flow router 414 coupled to the lumen 410 can allow fluid flow within the passageway to be restricted and directed as desired. In part, this is because the fluid flow router 414 can provide a route for the fluid so that it can be directed to the selected area by the flow opening. 416. Accordingly, the fluid flow router 414 can be fashioned similar to a flexible hose and can be of any length. For example, the body 402 can be expanded within an air conditioner passageway so that objects form conduits within the external surface and so that fluid flow is restricted to pass through the lumen. The fluid flow router 414 can be selectively placed near an electronic device air intake so that cool air from the passageway is routed to the electronic device.

As shown in FIG. 14B, the present invention can include a memory foam device 420 having a fluid flow router 434 extending from a first memory foam member 422a to a second memory foam member 422b. Accordingly, each memory foam member 422a, 422b can have a first end 424a, 424b and a second end 426a, 426b. As shown, the fluid flow router 434 can be coupled between the lumens 430a, 430b of the respective memory foam members 422a, 422b. As shown, each lumen 430a, 430b can extend from a first opening 428a, 428b in the first end 424a, 424b to a second opening 432a, 432b in the second end 426a, 426b of the respective memory foam members 422a, 422b. The fluid flow router 434 coupled to each of the lumens 430a, 430b can allow fluid flow within the passageway to be restricted and directed from the first memory foam member 422a to the second memory foam member 422b, or vice versa. In part, this is because the fluid flow router 434 can provide a route for the fluid so that it can be directed as desired. Accordingly, the fluid flow router 434 can be fashioned similar to a flexible hose and can be of any length. For example, the first memory foam member 422a can be disposed and expanded within a first passageway so that fluid flow is restricted to pass through the fluid flow router 434 to the second memory foam member 422b disposed and expanded within a second passageway. This can allow fluid to be selectively passed from the first passageway into a second passageway. For example, the first passageway can be an air conditioning passageway and the second passageway can be an air flow passageway within a server rack or an opening in a server rack. Optionally, the fluid flow router 434 can be removably coupled with at least one of the memory foam members 422a, 422b.

While the foregoing embodiments of the present invention have been described with specific elements, such elements can be combined or separated as desired. Accordingly, an embodiment of the present invention can include multiple elements from different figures as described herein.

While the foregoing embodiments of memory foam in accordance with the present invention have been depicted and described in connection to a piece of memory foam having a circular cross-sectional profile, other shapes can be used depending on the shape of the passageway. Also, the foregoing embodiments depicted and described in connection with receiving portions of the memory foam being substantially circular so as to be capable of receiving objects that have similarly shaped and sized cross-sectional profile such as power cords, data cords, and the like. However, the receiving portions can have various other shapes to correspond with the cross-sectional profile of other types of objects such as those objects that have rectangular, square, or other polygonal shapes.

Figure 15:
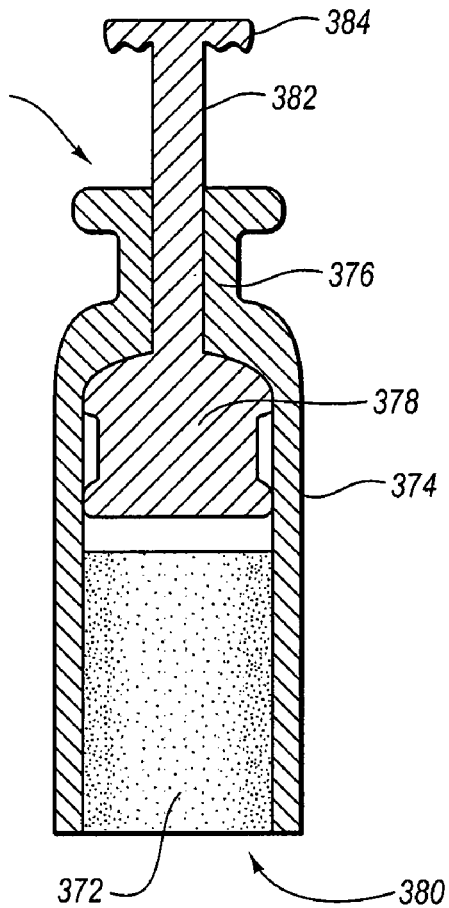
FIG. 15 is a side view of an embodiment of a memory foam applicator containing a memory foam member in a compressed configuration.
Figure 16:
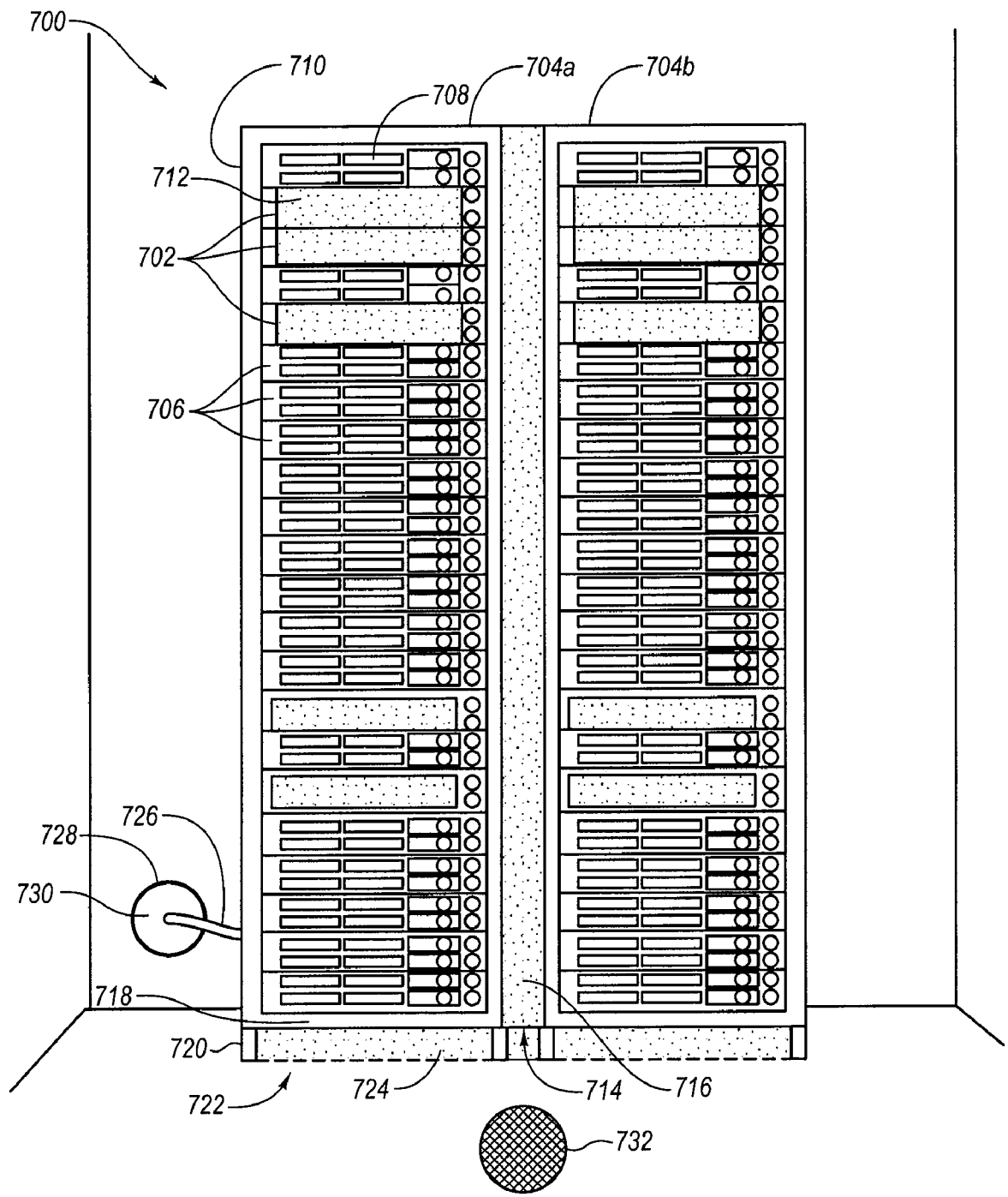
FIG. 16 is a front view of an embodiment of a data storage system having multiple server racks.
Figure 8:
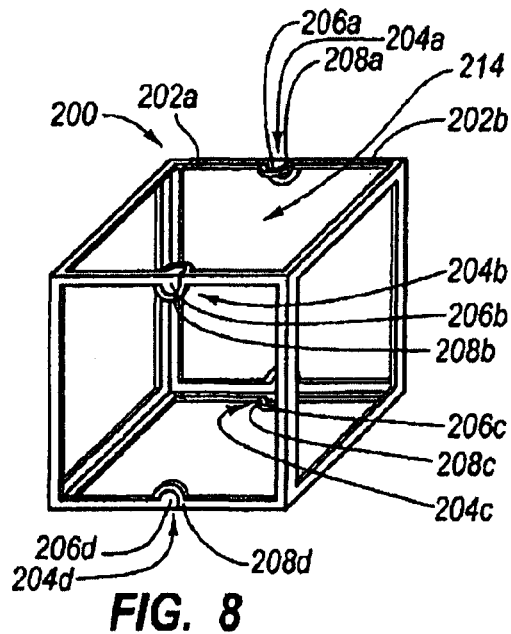

Additionally, the present invention can include a memory foam applicator 370 as shown in FIG. 15. The applicator 370 can be configured to deliver a memory foam member 372 in the compressed configuration so that release from the applicator can allow for expansion. The applicator 370 can be especially beneficial for delivering a compressed memory foam member 372 into passageways or positions within passageways that are difficult to reach by hand. Accordingly, the applicator 370 can include a compressing member 374 having a chamber 380 retaining the memory foam member 372 in a compressed configuration. The chamber 380 can also include a plunger 378 disposed therein and adjacent to the memory foam member 372 so that actuation of the plunger 378 can push the memory foam member from the chamber. Accordingly, the applicator 370 can include a barrel 376 for slidably receiving a shaft 382 that actuates the plunger 378, wherein the barrel 376 can be integral or coupled with the compressing member 374. Optionally, the shaft 382 can include a handle 384 that allows for manual actuation of the shaft 382 and plunger 378. For example, the applicator 370 can be used by having a compressed memory foam member 372 disposed within the chamber 380 of the compressing member 374 such that actuation of the shaft 382 causes the plunger 378 to push the compressed memory foam member from the chamber.

IV. Methods of Using Memory Foam in a Passageway

Generally, memory foam in accordance with the present invention can be used in a method which restricts fluid flow in a passageway. Such a method can include providing a passageway capable of passing fluid therethrough and having an object extending through the passageway. The memory foam can be compressed from an expanded cross-sectional profile that is the same or larger than the cross-sectional profile of the passageway to a size smaller than a cross-sectional profile of the passageway. The compressed memory foam can be inserted into the passageway and adjacent to the object so that a receiving portion of the memory foam receives the object. After receiving the object, the memory foam can be expanded so that the memory foam securely fits within the passageway and so that the receiving portion expands around the object thereby self-forming a conduit around the object.

In one embodiment, the receiving portion can be configured to include a slit, hole, aperture, recess, cavity, collapsible hole, or combination thereof. Also, the receiving portion of the memory foam can be configured to receive an object that is a substantially flexible tubular member.

Additionally, the memory foam can be warmed before and/or during the compression so as to be soft and compressible before inserting the memory foam into the passageway. Usually, the memory foam is heated up to about 25 degrees warmer than room temperature (e.g., 25° C.). For example, the warming can be achieved by holding and manipulating the memory foam with a hand of a person.

Also, the memory foam can be cooled after being inserted into the passageway. Usually, the memory foam is cooled up to about 25 degrees colder than room temperature. The cooling can be achieved with a cool fluid that is disposed or passing within the passageway. For example, the cooling can be achieved with cool air flowing through the passageway such as an air condition duct.

Figure 2:
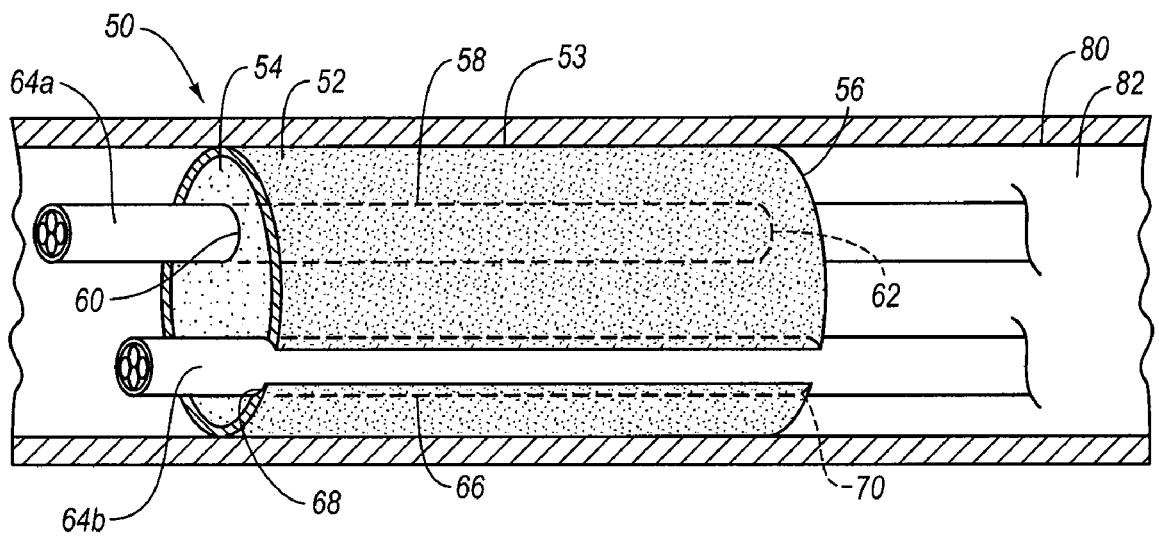
FIG. 2 is a perspective view of the device of FIG. 1 disposed within the lumen of a vent and having cords extending through self-forming conduits.

FIG. 2 is a perspective view of memory foam 50 having self-formed conduits 58, 66. As shown, the memory foam 50 is disposed within the passageway 82 of an air conditioning duct 80. As such, the memory foam 50 has been previously compressed and had objects 64a, 64b received into the self-formed conduits 58, 66, and then expanded so as to form a barrier within the passageway 82 that can restrict fluid flow through the duct 80. The compressed memory foam 50 can be inserted into the passageway 82 before or after receiving the objects 64a, 64b into the self-formed conduits 58, 66.

The memory foam 50 is shown to have a first end 54 and a body 52 extending to an opposite second end 56. Accordingly, the memory foam 50 can include a self-formed internal conduit 58 that has a first opening 60 and a second opening 62. The first end 54 of the memory foam 50 can include the first opening 60 and the second end 56 can include the second opening 62. Additionally, an external surface 53 of the memory foam 50 is shown to have an external conduit 66. As such, the external conduit 66 can be disposed at the external surface 53 and has a first opening 68 in the first end 54 and a second opening 70 in the second end 56 of the memory foam 50.

As shown, the memory foam 50 has been compressed in a manner such that it can subsequently enlarge and/or open the internal conduit 58 and external conduit 66 so as to be capable of receiving the objects 46a, 46b. With respect to the internal conduit 58, the object 64a can be received into the internal conduit 58 by opening and/or enlarging the first opening 60 of the first end 54 and passing the object 64a therethrough. Additionally, the body 52 of the memory foam 50 can be compressed in a manner that creates, opens, and/or enlarges the internal conduit 58 so as to be capable of passing the object 64a therethrough. Also, the second opening 62 of the second end 56 can be opened and/or enlarged similarly to the first opening 60 of the first end 54 so that the object 64a can be passed therethrough. Internal conduits 58 can be useful for receiving objects 64a that include a free end (not shown) that can be threaded through the conduit 58.

After the object 64a is passed through the opened and/or enlarged conduit 58, the memory foam 50 can be relaxed so as to expand toward the fully expanded size. As the expansion occurs, the conduit 58 self-forms around the object 64a so as to fit securely therearound. The expansion of the memory foam 50 can occur all along the conduit 58 from the first end 54 to the second end 56 so that both the first end 60 and second end 62 close around the object 64a.

With respect to the external conduit 66, the entire external conduit 66 from the first opening 68 to the second opening 70 can be enlarged by compressing the body 52 of the memory foam 50 around the external conduit 66. The expanded external conduit 66 can then receive the object 64b. After the object 64b is received into the expanded external conduit 66, the memory foam 50 can be relaxed so as to expand into the fully-expanded size. As the expansion occurs, the external conduit 66 self-forms around the object 64b so as to fit securely therearound. The expansion of the memory foam 50 can occur all along the conduit 66 from the first end 68 to the second end 70.

External conduits 66, or those that can open to the external surface 53 (e.g., cavity 20, internal cavity 26, and hole 32 of FIG. 1), can be beneficial for receiving an object 64b that is already disposed within the passageway 82. The ability to self-form a conduit 66 with memory foam 50 around an object 64b that is already disposed within the passageway 82 can allow the object 64b to be received into the conduit 66 without disconnecting an end (not shown) of the object 64b. Thus, the external conduits 66 can be used to retrofit the memory foam 50 into the passageway 82 and around the existing object 64b without disconnecting an end of the object 64b.

Additionally, the memory foam device can be used with objects that extend through the passageway by placing the compressed memory foam device within the passageway so that the objects are pressed toward the perimeter of the passageway during expansion. As the memory foam expands, the conduits are self formed around the objects and with the perimeter of the passageway. For example, an air conditioning duct can have a plurality of data cords and power cords extending therethrough, and the memory foam device in a compressed configuration can be placed within the passageway so that the data cords and power cords are positioned at the perimeter of the passageway. As the memory foam expands outwardly toward the perimeter of the passageway, the conduits can self form around the cords.

III. Housing

The flow restricting device in accordance with the present invention can further include a housing configured to securely fit within a passageway and to securely contain memory foam within a chamber disposed within the housing. The housing can be configured for being disposed at an outlet of the passageway or at any position within the passageway. As such, the housing can have a shape and size that can be received into the passageway. Also, the chamber can be defined by the housing and can have a shape and size for receiving the memory foam.

A. Housing Configurations

Figure 3:
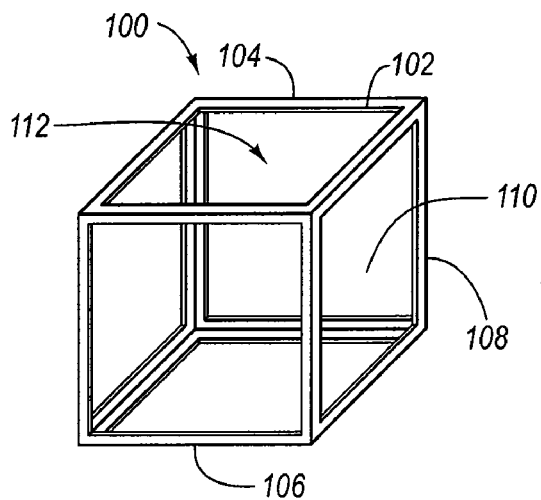
FIGS. 3-8 are perspective views of different embodiments of housings for memory foam configured to self-form conduits around objects extending therethrough.

FIG. 3 is a perspective view of an embodiment of a housing 100 configured for being disposed within a passageway and for receiving memory foam in accordance with the present invention. As such, the housing 100 can be comprised of a body 102 that defines a chamber 110 disposed therein. The housing 100 can include at least one first end member 104 that is connected to at least one second end member 106 through at least one side member 108. The at least one first end member 104, at least one second end member 106, and at least one side member 108 can cooperate to define at least one wall 110. The at least one wall 110 can be a solid wall that at least partially encloses the chamber 112. Alternatively, the at least one wall 110 can be configured as an opening or an aperture that extends into the chamber 112. Additionally, the at least one first end member 104, at least one second end member 106, and at least one side member 108 can cooperate to define the chamber 112. The chamber 112 can be configured for receiving memory foam having self-forming conduits.

Figure 4:
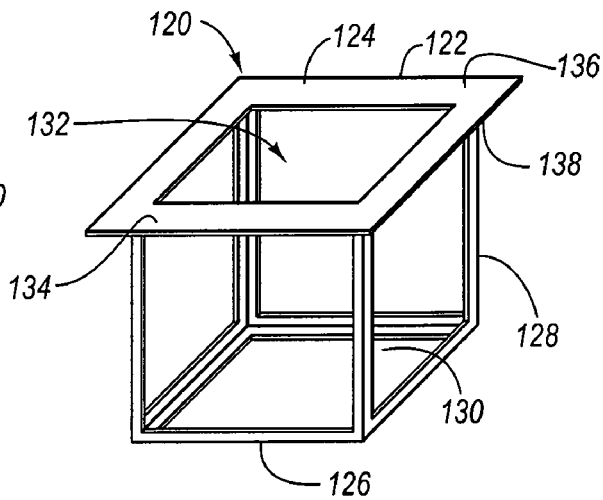

FIG. 4 is a perspective view of an embodiment of a housing 120 configured for being disposed at the opening of a passageway and for receiving memory foam in accordance with the present invention. As such, the housing 120 can be comprised of a body 122 that defines a chamber 132 disposed therein. The housing 120 can include at least one first end member 124 that is connected to at least one second end member 126 through at least one side member 128. The at least one first end member 124, at least one second end member 126, and at least one side member 128 can cooperate to define at least one wall 130. The at least one wall 130 can be a solid wall that at least partially encloses a chamber 132. Alternatively, the at least one wall 130 can be configured as an opening or an aperture that extends into the chamber 132. Additionally, the at least one first end member 124, at least one second end member 126, and at least one side member 128 can cooperate to define the chamber 132. The chamber 132 can be configured for receiving memory foam having self-forming conduits.

Additionally, the at least one first end member 124 can include a lip 134. The lip 134 can be defined by a first surface 136 and a second surface 138. The lip 134 can extend from the at least one first end member 124 outwardly away from the chamber 132. As such, the lip 134 can be disposed at the opening of a passageway so that the first surface 136 of the lip 134 is external to the passageway and so that the second surface 138 is disposed on the body defining the opening of the passageway. Thus, the second surface 138 of the lip 134 can be placed adjacent to the opening of the passageway.

Figure 5:
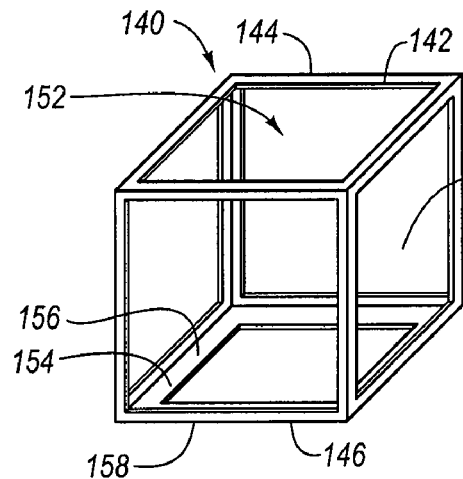

FIG. 5 is a perspective view of an embodiment of a housing 140 configured for being disposed within a passageway and for receiving memory foam in accordance with the present invention. As such, the housing 140 can be comprised of a body 142 that defines a chamber 152 disposed therein. The housing 140 can include at least one first end member 144 that is connected to at least one second end member 146 through at least one side member 148. The at least one first end member 144, at least one second end member 146, and at least one side member 148 can cooperate to define at least one wall 150. The at least one wall 150 can be a solid wall that at least partially encloses a chamber 152. Alternatively, the at least one wall 150 can be configured as an opening or an aperture that extends into the chamber 152. Additionally, the at least one first end member 144, at least one second end member 146, and at least one side member 148 can cooperate to define the chamber 152. The chamber 152 can be configured for receiving memory foam having self-forming conduits.

Additionally, the at least one second end member 146 can include a shelf 154. The shelf 154 can be defined by a first surface 156 and a second surface 158. The shelf 154 can extend from the at least one second end member 146 inwardly into the chamber 152. As such, the shelf 154 can be disposed within the chamber 152. The shelf 154 can be configured for holding the memory foam when disposed within the chamber 152 so that the memory foam is retained within the chamber. As such, the shelf 154 can hold the memory foam during or after expansion so that the memory foam is held in place and is prevented from slipping into the passageway.

Figure 6:
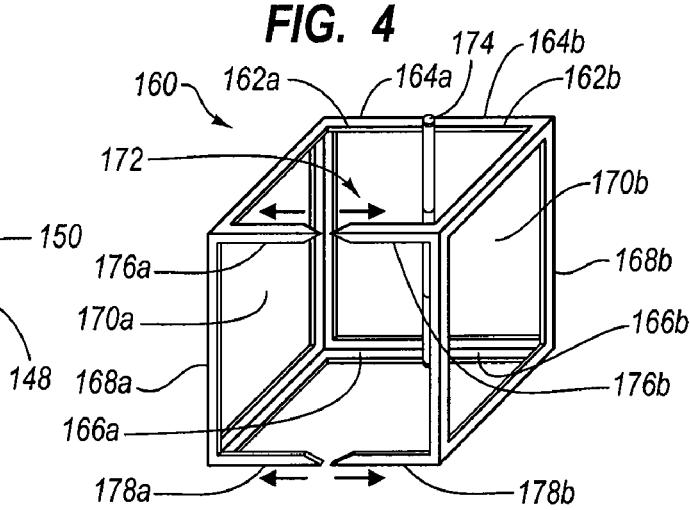

FIG. 6 is a perspective view of an embodiment of a two-piece housing 160 configured for being disposed within a passageway and for receiving memory foam in accordance with the present invention. As such, the two-piece housing 160 can be comprised of a first body 162*a* and a second body 162*b* that are combined to define a chamber 172 disposed therein. The first body 162*a* can include at least one first end member 164*a* that is connected to at least one second end member 166*a* through at least one side member 168*a*. The at least one first end member 164*a*, at least one second end member 166*a*, and at least one side member 168*a* can cooperate to define at least one first wall 170*a*. The at least one first wall 170*a* can be a solid wall that at least partially encloses the chamber 172. Alternatively, the at least one first wall 170*a* can be configured as an opening or an aperture that extends into the chamber 172.

The second body 162*b* can include at least one first end member 164*b* that is connected to at least one second end member 166*b* through at least one side member 168*b*. The at least one first end member 164*b*, at least one second end member 166*b*, and at least one side member 168*b* can cooperate to define at least one second wall 170*b*. The at least one second wall 170*b* can be a solid wall that at least partially encloses the chamber 172. Alternatively, the at least one second wall 170*b* can be configured as an opening or an aperture that extends into the chamber 172.

Additionally, the first body 162*a* and second body 162*b* can be coupled together through a hinge 174. Opposite of the hinge 174, the first body 162*a* can include a first top connecting member 176*a* and a first bottom connecting member 178*a*, and the second body 162*b* can include a second top connecting member 176*b* and a second bottom connecting member 178*b*. The hinge 174 can allow for the first body 162*a* to be opened so as to open the chamber 172. When the hinge 174 is actuated the first top connecting member 176*a* can be separated away from the second top connecting member 176*a* and the first bottom connecting member 178*a* can be correspondingly separated away from the second bottom connecting member 178*b*.

The chamber 172 can be opened by the first body 162*a* being opened away from the second body 162*b* through actuation of the hinge 174. This can allow for objects that are longer than the chamber 172 to be placed into the open chamber 172 and pass therethrough after the hinge 174 is actuated to close the chamber 172. For example, in the instance the object is a data cord the housing 160 can be opened by actuating the hinge 174 in order to open the chamber 172 so as to be capable of receiving the data cord into the chamber 172 without disconnecting the data cord. Also, this configuration can allow for the housing to be used to retrofit within a passageway already having objects, such as data cords, so that the objects do not have to be disconnected at one end and passed through the chamber 172.

In an alternative embodiment, the housing can be a single housing comprised of a flexible material that can be similarly opened. As such, the housing can be flexed or bent so as to open the chamber. Thus, a housing comprised of a flexible material can be used similarly as a housing with a hinge.

Figure 7:
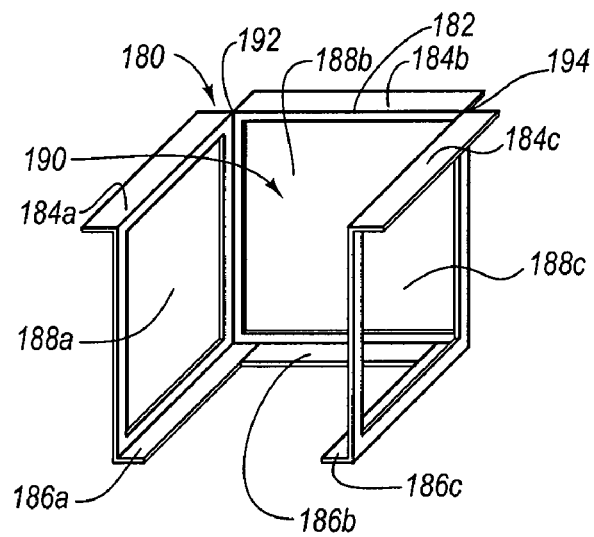

FIG. 7 is a perspective view of an embodiment of a three-sided housing 180 configured for being disposed within a passageway and for receiving memory foam in accordance with the present invention. As such, the three-sided housing 180 can be comprised of a body 182 that at least partially defines a chamber 182 disposed therein. The chamber 182 can be substantially open by being defined by three sides 186*a-c* and having an open side. The three-sided housing 180 can include the following: a first top member 184*a* that is connected to a first bottom member 186*a* through a first side member 188*a*; a second top member 184*b* that is connected to a second bottom member 186*b* through a second side member 188*b*; and a third top member 184*c* that is connected to a third bottom member 186*c* through a third side member 188*c*. The side members 188*a-b* can be solid walls, walls that define apertures, or the like.

Additionally, the three-sided housing 180 can be configured to include various other elements depicted and described in connection with FIGS. 3-6. For example, each of the top members 184*a-c* can be configured as a lip that projects outwardly from the chamber 190 similarly as depicted and described in connection with FIG. 4. Also, each of the bottom members 186*a-c* can be configured as a shelf that projects inwardly into the chamber 190 similarly as depicted and described in connection with FIG. 5. Further, the first members (184*a*, 186*a*, and/or 188*a*) can be coupled to the second members (184*b*, 186*b*, and/or 186*c*) via a flexible corner 192, which can allow the third members to bend or rotate with respect to the second members. Similarly, the third members (184*c*, 186*c*, and/or 188*c*) can be coupled to the second members (184*b*, 186*b*, and/or 186*c*) via a flexible corner 194, which can allow the third members to bend or rotate with respect to the second members. Accordingly, the flexible corners 192, 194 can allow the first members and third members to bend or rotate away from the second members in a manner similar to the function of the hinge 174 of FIG. 6.

Figure 8:
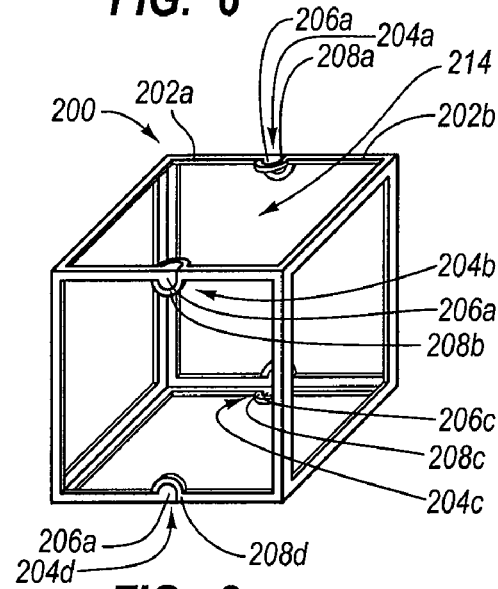

FIG. 8 is a perspective view of an embodiment of a couplable housing 200 configured for being disposed within a passageway and for receiving memory foam in accordance with the present invention. The couplable housing 200 can be comprised of a first body 202*a* and a second body 202*b* that defines a chamber 214 disposed therebetween. Both the first body 202*a* and second body 202*b* can be configured similarly as the three-sided housing 180 of FIG. 7. The first body 202*a* can be coupled to the second body 202*b* through at least one fastener 204*a-d*. A single fastener 204*a* can be comprised of a first fastener member 206*a* disposed on the first body 202*a* and a second fastener member 208*a* disposed on the second body 202*b*. As shown, the first fastener member 206*a* can be a male fastener that can be received into the second fastener member 208*a*, which is a female fastener. However, the first fastener member 206*a* and second fastener member 208*a* can be configured as other fasteners well known in the art.

The couplable housing 200 can be configured such that the first body 202*a* can be selectively coupled to the second body 202*b*. This can allow the chamber 214 within couplable housing 200 to be opened in the instance the first body 202*a* is not coupled to the second body 202*b*, or closed in the instance the first body 202*a* is coupled to the second body 202*b*. As such, the chamber 214 can be opened so that long objects, such as power or data cords, can be extended through the chamber 214 before the first body 202*a* is coupled to the second body 202*b* to form the couplable housing 200. As before, chambers 214 that can be opened are beneficial for retrofitting around existing power and data cords so that the cords do not have be disconnected and threaded through the chamber.

Additionally, the individual elements of the various housings depicted and/or described herein can be interchanged with respect to each other. This can allow features of one housing to be combined with features of another housing. For example, the lip 134 of FIG. 4 and the shelf 154 of FIG. 5 can be combined with the couplable housing 200 of FIG. 8. Moreover, the housings can be prepared from a variety of materials. Preferred materials include various plastics and metals.

B. Housing and Memory Foam System

The present invention can also include a flow restricting system comprised of a housing and memory foam having self-forming conduits. As such, the flow restricting system can include any of the memory foam configurations described herein. Additionally, the flow restricting system can include any of the housing configurations described herein. In one embodiment, the memory foam can be coupled to the housing. In another embodiment, the memory foam can be couplable with the housing and can be separated therefrom. In yet another embodiment, a housing having a shape and size corresponding to a passageway can be included in a system that has a plurality of memory foam pieces, wherein each memory foam piece can have a different configuration for different types of passageways and/or objects disposed in the passageways.

C. Use of Housing and Memory Foam System in a Passageway

Generally, a flow restricting system in accordance with the present invention can be used in a method of restricting fluid flow in a passageway. Such a method can include providing a passageway capable of passing fluid therethrough and having an object extending through the passageway with or without passing a free end of the object through a chamber in the housing. The housing can be inserted into the passageway with or without passing a free end of the object through a chamber in the housing. The housing can be configured to fit securely within the passageway, which fit can be produced by the use of friction or by being selectively coupled to the passageway. In one example, the housing can be bonded to the passageway through an adhesive. In another example, the housing can be bolted or otherwise fastened to the passageway. In any event, the housing can be disposed within the passageway such that the object extends through a chamber defined by a body of the housing.

The method can further include compressing a piece of memory foam to a size smaller than a cross-sectional profile of the chamber. Typically, the memory foam has an expanded cross-sectional profile that is the same or larger than the cross-sectional profile of the chamber. The memory foam can then be inserted into the chamber and disposed adjacent to the object so that a receiving portion of the memory foam receives the object. The memory foam can then be expanded so as to securely fit within the chamber and so that the receiving portion expands around the object, thereby self-forming a conduit around the object.

In one embodiment, the receiving portion can be configured to include a slit, hole, aperture, recess, cavity, collapsible hole, or combination thereof. Also the object can be a flexible tubular member, such as a power cord, data cord, or the like. In any event, the receiving portion can be configured for receiving any type of object.

In one embodiment, the memory foam can be warmed so as to be soft and compressible before inserting the memory foam into the chamber. The warming can be accomplished by a person holding the memory foam and applying pressure to the memory foam. Also, the memory foam can be cooled after being inserted into the chamber. The cooling can be accomplished by the memory foam coming into contact with a cool fluid within the passageway; for example, by passing cool air by the memory foam.

In one embodiment, the method can further include positioning the housing at an opening of the passageway so that a first end of the housing is disposed at the opening of the passageway, and so that an outwardly projecting lip of the first end of the housing outwardly projects from the opening. The projecting lip can prevent the first end of the housing from entering into the passageway.

In one embodiment, the housing can include a second end having an inwardly projecting shelf at least partially defining the chamber. As such, the memory foam can be positioned in the chamber on the shelf so that the expanded memory foam is disposed on the shelf.

In one embodiment, the housing can be configured to open so as to expose the chamber, which is illustrated by the housings of FIGS. 6 and 8. As such, the method can include the following: opening the housing so as to open the chamber; placing the housing around the object so that the object is disposed within the opened chamber; and closing the housing so that the chamber is closed around the object.

In one embodiment, the housing can include a first wall that has a separable portion extending from a first end of the wall to a second end of the wall. The separable portion can divide a first portion of the first wall from a second portion of the first wall and the first portion can be capable of separating from the second portion to open the housing and thereby open the chamber. As such, the method can include the following: opening the separable portion so as to separate the first portion of the first wall from the second portion of the first wall to open the chamber; inserting the object into the opened chamber; and closing the separable portion so as to adjoin the first portion of the first wall to the second portion of the first wall to close the chamber around the object.

In one embodiment, the housing can include a second wall having a hinge (FIG. 6) so that actuation of the hinge separates the first portion of the first wall from the second portion of the first wall. Also, the method can include actuating the hinge so as to open the chamber, and inserting the object into the chamber. This can be beneficial when the object is a cord that does not include a free end to pass through the chamber.

In another embodiment, the first portion can include a first fastener and the second portion can include a second fastener, wherein the first fastener and second fastener can fasten together to couple the first portion of the first wall with the second portion of the first wall. Optionally, the first fastener is a male fastener and the second fastener is a female fastener as shown in FIG. 8.

IV. Data Storage Facilities

In one embodiment of the invention, a data storage facility constructed to house computer equipment containing important data can include an air conditioning duct having an airflow restricting device for restricting air flow through the air conditioning ducts. As such, an airflow restricting device having memory foam in accordance with the present invention can be disposed within an air conditioning duct or at the opening of such a duct. Also, an air conditioning system can have a duct and vent arranged so that the cooled air is blown towards an air inlet of a computer (e.g., front of computer), where the duct is substantially devoid of an airflow restricting device. Additionally, the air conditioning system can include a duct with an opening that can blow cool air towards the air outlet of a computer (e.g., back of computer), and can include an airflow restricting device in such a duct. Thus, an airflow restricting device can inhibit cooled air from being blown on the computer air outlets and wasted.

Additionally, a data storage facility or data storage room housing computers can have power cords and data cords passing through an air conditioning duct having an airflow restricting device. As such, a large number of cords can be disposed within the air conditioning duct and passed through or around the airflow restricting device, having one end connected to a computer and another end connected to a different computer. Accordingly, the air conditioning duct can include the airflow restricting device to restrict the flow of cool air towards the computer air outlet, wherein the airflow restricting device can be configured to allow cords to be passed therethrough and to restrict the flow of cool air. Additionally, the airflow restricting device can be inserted into the air conditioning duct already having cords passing therethrough without requiring the cords to be unplugged at one end and routed through the airflow restricting device. Thus, the airflow restricting device can be used to restrict airflow in an air conditioning duct without unplugging a cord or a plurality of cords For example, the present invention can include an airflow restricting device that can be used to selectively restrict the flow of cool air through an air conditioning duct or from an opening in the air conditioning duct. Additionally, the airflow restricting device can be used to selectively restrict the flow of cool air through an air conditioning duct containing power cords or data cords being passed therethrough. Further, the airflow restricting device can be retrofitted into an air conditioning duct to selectively restrict the flow of cool air without having to disconnect an end of a cord or plurality of cords that are disposed within the air conditioning duct.

A. Computer Racks

Additionally, the invention can include a memory foam member configured for removable placement as a barrier within a computer rack. Computer racks (e.g., Dell Power-Edge Racks®) can also be referred to as computer cabinets, server cabinets, server racks, and the like, and are configured to hold a number of computers or servers racks. A computer rack can be deployed almost anywhere, such as in a data center. Traditional computer racks cool from the bottom up by taking in cool air being pumped into the data center through a raised floor. Newer racks are configured to allow the computers or servers to cool front to back, thereby allowing them to be used in any environment, a data center, a remote office, a wiring closet, or even a factory floor. The memory foam member of the present invention can be configured for traditional and newer racks.

Data centers have been designed to implement the newer racks by blowing cold air toward the front of the rack and computers contained therein. This allows the air inlet at the front of the computer or server to receive cold air and then blow heated air (e.g., from operation of the computer or server) out the back. However, due to the gaps, holes, spaces, empty slots, and the like that are present in the front of a computer rack, a lot of hot air can circulate or be redirected from the back of the computer or server toward the front so that the cold air is actually heated by the heated air. As such, the flow of heated air from the back of a computer or server can counteract an air-conditioning system and result in inefficient cooling. Therefore, the memory foam member of the present invention can be employed in a computer rack to restrict airflow from moving hot air from the back of the rack toward the front of the rack. This can include the memory foam member being placed at or in gaps, holes, spaces, empty slots, and the like that are present in the front of a computer rack in order to inhibit unwanted airflow. The gaps, holes, spaces, empty slots, and the like are considered to be airflow passageways in computer racks.

Accordingly, the memory foam member can be configured to form an airflow-restricting barrier at the front of the rack so that hot air is prevented from flowing into the front air intake or from mixing with the cold air. As such, the memory foam can be compressed and inserted into a hole or space at the front of the rack so that the expanded foam forms the barrier. This can include placing the memory foam in gaps between servers, in empty server slots, between servers, in spaces around the interior edge of the rack, at the bottom of the rack next to the floor, between the top of the rack and the ceiling, and any other place within the rack, between racks, or between the rack and the floor where heated air may pass through. The memory foam member can have a shape, size, and/or cross-sectional profile that are larger than the cross-sectional profile of the hole or space being blocked or sealed so that compression of the memory foam enables placement into the hole or space and expansion of the foam provides a snugly fitting barrier. As the foam expands towards its fully expanded state, it forms the barrier having a shape that corresponds with the cross-sectional profile of the hole or space.

For example, the memory foam member can be configured to function as a blanking strip that can be compressed to fit into an empty server slot. In another example, the memory foam member can be compressed and placed between the rack housing and the floor when the rack includes legs, rollers, or the like so as to be elevated off of the floor. In a further example, the memory foam member can be compressed and placed between adjacent racks in order to prevent heated air from flowing between the racks toward the front of the rack and mixing with the cold air. In yet another example, the memory foam can be compressed and placed between the computer rack and the ceiling. Thus, the memory foam member can be configured to be used basically anywhere in relation to a computer rack in a data storage center in order to block the flow of heated air from the back of the computers or servers so that the cooling capacity at the front is maximized.

Referring to FIG. 15, the present invention includes a data storage system 700 having a first rack cabinet 704a and a second rack cabinet 704b that are each capable of holding a plurality of stacked electronic devices 706. A plurality of slots 702 is contained within each of the cabinets 704a, 704b, wherein the slots 702 cooperate to secure a plurality of stacked electronic devices 706. As shown, multiple electronic devices 706 are inserted into the slots 702 in a vertical orientation; however, horizontal or combinations of vertical and horizontal orientations can be employed. The individual electronic devices 706 have substantially planar upper and lower surfaces, an air inlet vent formed in the upper surface proximal to the air inlet cabinet side (e.g., front), and an exhaust vent formed in the upper surface proximal to the exit cabinet end (e.g., back).

In the illustrative embodiments, the system 700 is shown containing a plurality of electronic devices 706 filling most of the corresponding slots 702 so that a majority of the inlet air flow passes through the electronic devices 706 to the exit. However, some of the slots 702 are devoid of electronic devices 706 and instead include a slot filler 712 in the form of a memory foam blanking strip. In operation, the electronic devices 706 are enclosed in the rack 704 or other housing having the air inlet at the front and an air outlet at the back so that the air inlet and air outlet are on mutually opposing sides with the rack 704. The air inlet supplies a cooling airflow stream to the electronic device air inlet vent and the air outlet vents exhaust air from the electronic device exhaust vents. Direct airflow, not passing through the electronic devices 706, from the air inlet to the exit is substantially otherwise obstructed. Substantial obstruction of direct airflow means that airflow in the system 700 nearly all flows through the electronic devices 706 except for a reasonable, limited amount of leaking through gaps between devices.

In some configurations, an electronic device 706 is enclosed in the rack 704 with multiple additional electronic devices 706. Airflow is obstructed from passing from the air outlet to the air inlet by multiple memory foam members. The rack 704 can be fully populated with the electronic devices 706 so that substantially all airflow from the housing air inlet to the outlet passes through the electronic devices 706.

In other arrangements, configuration, and embodiments, fewer than all of the slots 702 within the rack 704 may be populated by electronic devices 706. Avoidance or elimination of heated exhaust re-circulation from the electronic devices 706 back to the air inlet, and the potential for device over-heating, are desirable. As shown in FIG. 15, a frontal pictorial view shows an embodiment of a system 700 that uses one or more memory foam slot fillers 712 to oppose re-circulation. Accordingly, electronic devices 706 and slot fillers 702 can be inserted into the rack 704 to fill all slots. In the illustrative embodiment, the slot fillers 712 having dimensions that emulate dimensions of an electronic device 706. The electronic devices 706 and slot fillers 712 fill all of the corresponding slots so that substantially all of the air flow from the frontal air conditioning duct 732 passes through the electronic devices 706. As shown, a rear air conditioning duct 728 is blocked with a memory foam member 730 so that a data cable 726 from an electronic device 706 passes through a conduit in the memory foam member and through the rear air conditioning duct.

Additionally, FIG. 15 shows a variety of airflow regulating devices that can be employed in a data storage system 700. Accordingly, a pair of racks 704a, 704b that can be used in the data storage system 700 can be separated by a gap 714 between the racks 704a, 704b. Accordingly, a memory foam member 716 can be utilized as a rack gap filler. As such, memory foam member 716 can inhibit air from flowing from the back of the racks 704a, 704b through the gap 714.

Additionally, the racks 704a, 704b can be elevated off the ground by rack legs 720. As such, the rack legs 720 can create a rack leg space 722 between the rack base 718 and the floor. Accordingly, a memory foam member 724 can be used as a rack leg space filler. Thus, the memory foam member 724 can inhibit air from flowing from the back of the rack 704a through the rack leg space 722.

Additionally, the memory foam can be used at other locations within the racks 704a, 704b, or adjacent to the racks in order to inhibit air from flowing from the back toward the front. Accordingly, the memory foam members can be used in airflow management in a data storage system 700.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of restricting fluid flow in an airflow passageway in an air conditioning system having an object disposed therein, the method comprising:

inserting a memory foam member in a compressed configuration into the passageway of the air conditioning system and adjacent to the object so that a receiving portion of the memory foam member receives the object; and expanding the memory foam member to an expanded configuration so that the memory foam member securely fits within the passageway to restrict fluid flow and so that the receiving portion expands around the object thereby self forming a conduit around the object.

2. A method as in claim 1, wherein the compressed configuration of the memory foam member has a compressed cross-sectional profile that is smaller than a cross-sectional profile of the passageway, and the expanded configuration has an expanded cross-sectional profile that is the same or larger than the cross-sectional profile of the passageway.

3. A method as in claim 1, wherein the receiving portion is configured to include a slit, slot, hole, aperture, recess, crease, cavity, collapsible hole, or combination thereof.

4. A method as in claim 1, wherein the object is at least one of the following: a flexible tubular member; a power cord; a data cord; a pipe; a deformed portion of the passageway; or an electronic device.

5. A method as in claim 1, further comprising:

warming the memory foam member so as to be soft and compressible before the inserting the memory foam into the passageway; and cooling the memory foam member after being inserted into the passageway.

6. A method as in claim 1, further comprising at least one of the following:

identifying a passageway in need of restricted fluid flow, the passageway being capable of passing fluid therethrough and having an object extending through the passageway;

compressing the memory foam member to the compressed configuration;

inserting the memory foam member into an internal portion of the passageway;

inserting the memory foam member at an opening of the passageway;

inserting the memory foam into an intersection of the passageway;

inserting the memory foam into an opening of a first passageway that intersects a second passageway;

inserting the memory foam member with a memory foam applicator;

positioning the object at a perimeter of the passageway;

pulling the object taut; or inserting the object into the receiving portion.

7. A method as in claim 1, wherein the memory foam member comprises:

a first end;

a second end; and a body comprised of memory foam having an expanded shape and size that securely fits within the passageway so as to restrict fluid flow through the passageway, the memory foam having a receiving portion extending from the first end to the second end and the receiving portion being configured for receiving an object that extends from the first end to the second end so that a conduit is formed around the object by expanding the memory foam around the object.

8. A method as in claim 7, wherein the memory foam member further comprises at least one of the following: an elongated body; a water-scavenger; an antistatic component; a coating; a coating having a water scavenger; a coating having an antistatic components; a sealant coating; a water-resistant coating; a fire-retardant coating; a friction coating; a means of protecting the memory foam member; an adhesive on an external surface; an adhesive on an external surface having a peelable cover; a handle; a memory foam handle; a retrieving member; a retractable retrieving member; a retrieving member coupled to an anchor; a retrieving member coupled to a fastener; a retrieving member coupled to a lockable fastener; a means for removing the memory foam member from the passageway; an internal cavity; an internal cavity comprising an electronic device; an internal cavity comprising a thermocouple; an internal cavity comprising an inflatable bladder; or an accessible cavity.

9. A method of restricting fluid flow in an airflow passageway in an air conditioning system having an object extending therethrough, the method comprising;
   inserting a housing into the passageway so that the housing fits securely within the passageway and the object extends through a chamber defined by a body of the housing;
   inserting the memory foam member in a compressed configuration into the chamber and adjacent to the object so that a receiving portion of the memory foam member receives the object; and
   expanding the memory foam member to an expanded configuration so that the memory foam securely fits within the chamber and so that the receiving portion expands around the object thereby self-forming a conduit around the object.

10. A method as in claim 9, wherein the compressed configuration of the memory foam member has a compressed cross-sectional profile that is smaller than a cross-sectional profile of the housing, and the expanded configuration has an expanded cross-sectional profile that is the larger than the cross-sectional profile of the housing.

11. A method as in claim 9, further comprising at least one of the following:
   positioning the housing at an opening of the passageway so that a first end of the housing is disposed at the opening of the passageway so that an outwardly projecting lip of the first end of the housing outwardly projects from the opening, wherein the projecting lip prevents the first end of the housing from entering into the passageway;
   positioning the memory foam member in the chamber so that the expanded memory foam member is disposed on a shelf, wherein the housing has a second end having an inwardly projecting shelf at least partially defining the chamber.

12. A method as in claim 9, wherein the housing has a separable portion extending from a first end to a second end, wherein the separable portion divides a first portion of the housing from a second portion of the housing and the first portion is capable of separating from the second portion to open the housing, and further comprising:
   opening the separable portion so as to separate the first portion from the second portion to open the housing:
   inserting the object into the opened chamber; and
   closing the separable portion so as to adjoin the first portion with the second portion to close the housing around the object.

13. A method as in claim 12, wherein the housing includes a hinge so that actuation of the hinge separates the first portion of the housing from the second portion of the housing.

14. A method as in claim 12, wherein the first portion includes a first fastener and the second portion includes a second fastener, wherein the first fastener and second fastener fasten together to couple the first portion of the housing with the second portion of the housing.

15. A method of restricting airflow in an airflow passageway of a data storage system, the method comprising;
   providing a memory foam member having a first end opposite of a second end and an expanded cross-sectional profile;
   compressing the memory foam member from the expanded cross-sectional profile to a compressed cross-sectional profile, said expanded cross-sectional profile being larger than the cross-sectional profile of the passageway and the compressed cross-sectional profile being smaller than the cross-sectional profile of the passageway;
   inserting the memory foam member having the compressed cross-sectional profile into the airflow passageway in the data storage system adjacent an object in the passageway, the foam member including a receiving portion; and
   expanding the memory foam member toward the expanded cross-sectional profile so that the memory foam member securely fits within and fills the airflow passageway to restrict airflow through the passageway and so that the receiving portion expands around the object thereby self-forming a conduit around the object.

16. A method as in claim 15, further comprising at least one of the following:
   identifying an airflow passageway of a data storage system in need of restricted airflow, the airflow passageway being capable of passing hot air from an air outlet in an electronic device to an air inlet in the electronic device;
   inserting the memory foam member into an internal portion of the airflow passageway;
   inserting the memory foam member at an opening of the airflow passageway;
   inserting the memory foam into an opening of a first airflow passageway that intersects a second airflow passageway; or
   inserting the memory foam member with a memory foam applicator.

17. A method as in claim 16, wherein the airflow passageway is at least one of the following: an empty slot in a computer rack; a gap between adjacent electronic devices in a computer rack; a gap between an electronic device and a computer rack; a space around the interior edge of a computer rack; a space between a bottom of a computer rack and a floor under the rack; a space between a top of a rack and a ceiling over the rack; or a space between adjacent computer racks.

18. A method of restricting fluid flow in a passageway having an object disposed therein, the method comprising;
   providing a memory foam member having a first end opposite of a second end and an expanded cross-sectional profile that is devoid of a conduit extending from the first end to the second end;
   compressing the memory foam member from the expanded cross-sectional profile to a compressed cross-sectional profile, said expanded cross-sectional profile being larger than the cross-sectional profile of the passageway and the compressed cross-sectional profile being smaller than the cross-sectional profile of the passageway;
   inserting the memory foam member having the compressed cross-sectional profile into the passageway and adjacent to the object so that a receiving portion of the memory foam member receives the object; and
   expanding the memory foam member toward the expanded cross-sectional profile so that the memory foam member securely fits within the passageway to restrict fluid flow and so that the receiving portion expands around the object thereby self-forming a conduit around the object, said conduit extending from the first end to the second end of the memory foam member.

19. A method as in claim 18, wherein the memory foam member further comprises at least one of the following: an elongated body; a water-scavenger; an antistatic component; a coating; a coating having a water scavenger; a coating having an antistatic components; a sealant coating; a water-resistant coating; a fire-retardant coating; a friction coating; a means of protecting the memory foam member; an adhesive on an external surface; an adhesive on an external surface having a peelable cover; a handle; a memory foam handle; a retrieving member; a retractable retrieving member; a retrieving member coupled to an anchor; a retrieving member coupled to a fastener; a retrieving member coupled to a lockable fastener; a means for removing the memory foam member from the passageway; or combinations thereof 20. A method as in claim 18, wherein the passageway is located within a data storage system or an air-conditioning duct.

* * * * *

UNITED STATES PATENT AND TRADEMARK OFFICE
CERTIFICATE OF CORRECTION

PATENT NO. : 7,650,911 B2
APPLICATION NO. : 11/555162
DATED : January 26, 2010
INVENTOR(S) : Follet et al.

It is certified that error appears in the above-identified patent and that said Letters Patent is hereby corrected as shown below:

Drawings
Sheet 1, replace FIG. 1 with the figure depicted below, wherein the "coating" has been labeled as "15"

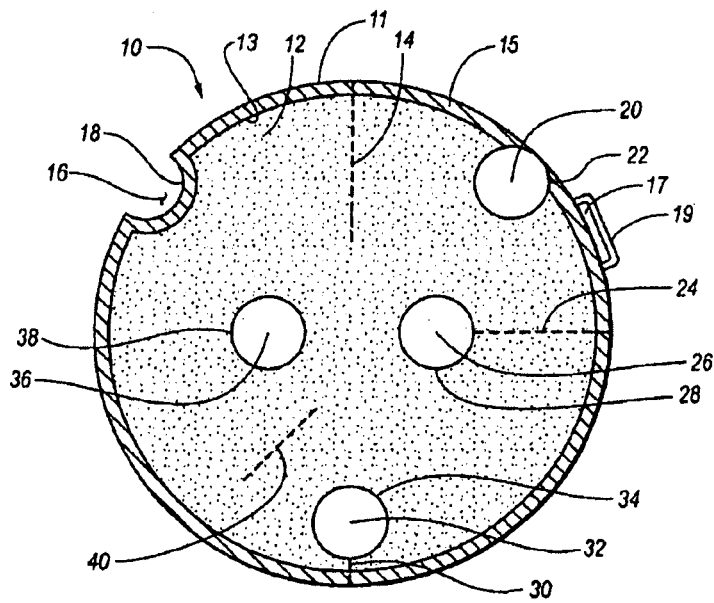

FIG. 1

Signed and Sealed this

Thirteenth Day of July, 2010

David J. Kappos
*Director of the United States Patent and Trademark Office*

Sheet 2, replace FIG. 8 with the figure depicted below, wherein the "first fastener members" have been correctly labeled Sheet 3, replace FIG. 11 with the figure depicted below, wherein the "second end" has been correctly labeled

CERTIFICATE OF CORRECTION (continued)
U.S. Pat. No. 7,650,911 B2

Sheet 3, replace FIG. 12 with the figure depicted below, wherein the "cords" have been labelled as "340"

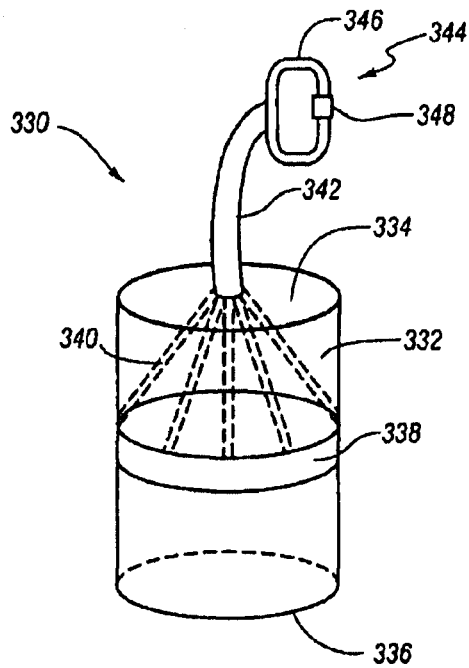

FIG. 12

Column 3
Line 15, delete "forming"
Line 32, change "the inserting" to --inserting--
Line 62, change "components" to --component--

Column 4
Line 23, change "compressed" to --a compressed--
Line 47, change "before the" to --before--

Column 5
Line 39, change "view" to --views--
Line 51, change "present" to --present invention--

Column 7
Line 38, change "gasses" to --gases--

Column 8
Line 5, change "objects" to --of objects--
Line 31, change "cavity to" to --cavity of--

Column 9
Line 6, delete "to conform to the shape of"
Line 10, after "of the" insert --foam, thereby increasing the density of the foam. Also, memory foam can be referred--

Column 10
Line 7, delete "a"
Lines 27-29, delete "[Note: Please provide a list of preferred materials to be used as coating.]"
Line 34, change "fictional" to --frictional--
Line 45, change "("UL")" to --("UL"))--

Column 11
Line 17, change "by" to --be--
Line 35, delete "at"
Line 40, change "included" to --included in the--
Line 49, change "contributed" to --contributing--
Line 57, change "by" to --be--
Line 64, delete "at"

Column 13
Line 29, change "22" to --28--
Line 59, change "internal cavity 26" to --hole 32--

Column 14
Line 24, change "as" to --like--

Column 16
Line 8, change "external" to --an external--
Line 23, change "expanding" to --expanded--
Line 39, change "embodiments" to --embodiments of--
Line 53, delete the "." after "opening"

Column 17
Line 40, change "profile" to --profiles--

Column 18
Line 23, change "combination" to --combinations--
Line 39, change "condition" to --conditioning--
Line 65, change "46a, 46b" to --64a, 64b--

Column 19
Line 39, change "conduits" to --conduit--

Column 20
Line 5, change "I 00" to --100--
Line 6, change "110" to --112--

Column 21
Line 47, change "176a" to --176b--

Column 22
Line 8, change both instances of "182" to --190--
Line 9, change "186a-c" to --188a-c--
Line 17, change "188a-b" to --188a-c--
Line 29, change "186c" to --188b--
Line 33, change "186c" to --188b--

Column 23
Line 1, change "have" to --have to--
Line 59, change "combination" to --combinations--

Column 25
Line 21, insert a --.-- after "cords"
Line 39, change "computers or servers" to --computer or server--

Column 26
Line 16, change "are" to --is--
Line 39, change "15" to --16--

Column 27
Line 18, change "15" to --16--
Line 22, change "702" to --712--
Line 33, change "15" to --16--

Column 28
Line 17, change "combination" to --combinations--
Line 24, change "the inserting" to --inserting--
Line 66, change "components" to --component--

Column 29
Line 32, change "the larger" to --larger--

Column 31
Line 7, change "components" to --component--

Column 32
Line 6, insert a --.-- after "thereof"